(12) United States Patent
Shibata et al.

(10) Patent No.: US 8,326,110 B2
(45) Date of Patent: Dec. 4, 2012

(54) FLEXIBLE OPTICAL WAVEGUIDE HAVING A CLADDING LAYER COMPOSED OF A RESIN FOR FORMING A CLADDING LAYER AND A BASE MATERIAL FILM

(75) Inventors: Tomoaki Shibata, Ibaraki (JP); Tatsuya Makino, Ibaraki (JP); Masami Ochiai, Ibaraki (JP); Atsushi Takahashi, Ibaraki (JP); Toshihiko Takasaki, Ibaraki (JP)

(73) Assignee: Hitachi Chemical Company, Ltd., Tokyo (JP)

(*) Notice: Subject to any disclaimer, the term of this patent is extended or adjusted under 35 U.S.C. 154(b) by 55 days.

(21) Appl. No.: 12/829,164

(22) Filed: Jul. 1, 2010

(65) Prior Publication Data

US 2010/0266258 A1    Oct. 21, 2010

Related U.S. Application Data

(62) Division of application No. 11/576,834, filed as application No. PCT/JP2005/018635 on Oct. 7, 2005, now Pat. No. 7,751,678.

(30) Foreign Application Priority Data

| Oct. 7, 2004 | (JP) | 2004-294703 |
|---|---|---|
| Dec. 13, 2004 | (JP) | 2004-359796 |
| Dec. 13, 2004 | (JP) | 2004-359797 |
| Mar. 15, 2005 | (JP) | 2005-073809 |
| May 11, 2005 | (JP) | 2005-138406 |
| Aug. 24, 2005 | (JP) | 2005-243430 |
| Aug. 24, 2005 | (JP) | 2005-243431 |
| Aug. 24, 2005 | (JP) | 2005-243432 |
| Aug. 24, 2005 | (JP) | 2005-243433 |

(51) Int. Cl.
*G02B 6/00* (2006.01)
*G02B 6/12* (2006.01)
*G02B 6/10* (2006.01)

(52) U.S. Cl. .................. 385/144; 385/14; 385/131

(58) Field of Classification Search .............. 385/14, 385/129–132, 141–145
See application file for complete search history.

(56) References Cited

U.S. PATENT DOCUMENTS 4,479,983 A    10/1984    Appelt et al.
(Continued)

FOREIGN PATENT DOCUMENTS

CN    1500231    5/2004
(Continued)

OTHER PUBLICATIONS

Supplementary European Search Report and European Search Opinion dated Feb. 4, 2009, for Application No. EP 05 79 0649.

(Continued)

*Primary Examiner* — Daniel Petkovsek
(74) *Attorney, Agent, or Firm* — Antonelli, Terry, Stout & Kraus, LLP.

(57) ABSTRACT

Disclosed, among other features, is a flexible optical waveguide, having one resin film for forming a core layer and two resin films for forming a cladding layer. At least one of the resin films for forming the cladding layer is composed of a resin for forming a cladding layer and a base material film, and the base material film is arranged on an outer side of the cladding layer with respect to the core layer.

4 Claims, 2 Drawing Sheets

U.S. PATENT DOCUMENTS

| | | | |
|---|---|---|---|
| 4,608,400 | A | 8/1986 | Yokoshima et al. |
| 4,634,602 | A | 1/1987 | Sirkoch et al. |
| 5,098,766 | A | 3/1992 | Gelorme et al. |
| 5,204,223 | A | 4/1993 | Taguchi et al. |
| 5,750,731 | A | 5/1998 | Ando et al. |
| 6,174,604 | B1 | 1/2001 | Akita et al. |
| 6,724,968 | B2 * | 4/2004 | Lackritz et al. ............... 385/131 |
| 6,996,303 | B2 * | 2/2006 | Glebov et al. .................. 385/14 |
| 7,164,814 | B2 * | 1/2007 | Ohtsu et al. ..................... 385/14 |
| 7,295,749 | B2 | 11/2007 | Kitamura et al. |
| 7,309,559 | B2 | 12/2007 | Natori et al. |
| 2002/0025992 | A1 | 2/2002 | Baba et al. |
| 2003/0123828 | A1 | 7/2003 | Garito et al. |
| 2004/0018446 | A1 | 1/2004 | Aoki et al. |
| 2004/0112859 | A1 | 6/2004 | Kubota et al. |
| 2004/0265539 | A1 | 12/2004 | Hashimoto et al. |
| 2005/0004288 | A1 | 1/2005 | Koyanagi et al. |
| 2005/0100722 | A1 | 5/2005 | Kitamura et al. |
| 2008/0260341 | A1 | 10/2008 | Shibata et al. |
| 2008/0275154 | A1 | 11/2008 | Sakayori |

FOREIGN PATENT DOCUMENTS

| | | |
|---|---|---|
| DE | 40 07 519 | 9/1991 |
| EP | 0 385 149 | 9/1990 |
| EP | 0 625 537 | 11/1994 |
| EP | 1227114 | 7/2002 |
| JP | 63-72703 | 4/1988 |
| JP | 63-314224 | 12/1988 |
| JP | 05-281428 | 10/1993 |
| JP | 11-258792 | 9/1999 |
| JP | 2000-007741 | 1/2000 |
| JP | 2002-012640 | 1/2002 |
| JP | 2003-026772 | 1/2003 |
| JP | 2003-048922 | 2/2003 |
| JP | 2003-048932 | 2/2003 |
| JP | 2003-195078 | 7/2003 |
| JP | 2003-195080 | 7/2003 |
| JP | 2003-195081 | 7/2003 |
| JP | 2003-215374 | 7/2003 |
| JP | 2004-033811 | 2/2004 |
| JP | 2004-339246 | 2/2004 |
| JP | 2004-191875 | 7/2004 |
| JP | 2004-294720 | 10/2004 |
| JP | 2005-503583 | 2/2005 |
| JP | 2006023376 A * | 1/2006 |
| JP | 2006-028204 | 2/2006 |
| JP | 2006-152016 | 6/2006 |
| JP | 2007-84772 | 4/2007 |
| WO | WO 03/072625 | 9/2003 |

OTHER PUBLICATIONS

Extended European Search Report dated Aug. 20, 2010, including a European Search Report and an European Search Opinion, for EP Application No. 09015388.3-2109/2159262.

Taiwanese Official Action dated Jun. 21, 2012, for TW Application No. 094135329.

* cited by examiner (a) CURING OF LOWER CLAD LAYER (b) LAMINATION OF RESIN FILM FOR FORMING CORE LAYER (c) EXPOSURE TO LIGHT (d) DEVELOPMENT (e) LAMINATION/CURING OF RESIN FILM FOR FORMING UPPER CLAD LAYER _FLEXIBLE OPTICAL WAVEGUIDE HAVING A CLADDING LAYER COMPOSED OF A RESIN FOR FORMING A CLADDING LAYER AND A BASE MATERIAL FILM_

This application is a Divisional application of application Ser. No. 11/576,834, filed Feb. 5, 2008, now U.S. Pat. No. 7,751,678, issued Jul. 6, 2010, which is a National Stage application, filed under 35 USC 371,of International (PCT) Application No. PCT/JP2005/018635, filed Oct. 7, 2005. The contents of Ser. No. 11/576,834, filed Feb. 5, 2008, are incorporated herein by reference in their entirety.

TECHNICAL FIELD

The present invention relates to a resin composition for an optical material having excellent heat resistance, transparency, and productivity, a resin film for an optical material, and an optical waveguide using the film as well as to a flexible optical waveguide having excellent flexibility, toughness, and productivity and to a method of producing the same.

BACKGROUND ART

To cope with an increase in volume of information concomitant with popularization of the Internet and Local Area Network (LAN), optical interconnection technology that uses optical signals is being under development not only in communication fields of main line and access type but also in short distance signal transmission between boards or in boards of routers and server devices. Specifically, to enable use of light in short distance signal transmission between boards or in boards in routers and server devices, optical/electronic boards that include an electric printed wiring board and an optical transmission path are under development.

In this case, it is desirable to use as the optical transmission path an optical waveguide that has a higher degree of freedom in wiring and is capable of being provided in higher density than optical fibers. Among others, optical waveguides made of polymer materials, which are excellent in processability and cost performance, show promise. Polymer optical waveguides have a structure that is adapted to coexist with electric printed wiring boards as mentioned above, they are required to have high heat resistance in addition to high transparency (low transmission loss). As materials for such an optical waveguide, fluorinated polyimides (see, for example, Patent Document 1 and Non-patent Document 1), deuterized silicone resins (see, for example, Non-patent Document 2), and epoxy resins (see, for example, Patent Document 2 and Non-patent Document 3) have been proposed.

On the other hand, the optical waveguides for use in the above-mentioned utility are required to have a core size of generally 50 μm square to ensure tolerance of connection with a light receiving or emitting device. This means that the core layer must have a thickness of about 50 μm. However, when materials for waveguides including, for example, deuterized silicone resins or fluorinated polyimides are used, there arises a problem in that it is difficult to realize a thickness of about 50 μm on an optical/electronic board or, if it is possible to realize, precision of film thickness will be poor because the materials for waveguides are generally include solvents having low viscosities although the resins themselves have high heat resistance to endure about 300° C.

Further, when fluorinated polyimide waveguide materials, which themselves have high heat resistance to endure about 300° C. and high transparency as high as 0.3 dB/cm at a wavelength of 850 nm, are used, film formation on an electric printed wiring board was difficult to be performed since film formation requires heating at 300° C. or more for several tens minutes to several hours. Further, fluorinated polyimides have no photosensitivity, so the method of fabricating optical waveguides by exposure to light and development can not be applied thereto, and they thus have poor productivity and poor applicability to large-area fabrication. Further, since optical waveguides are fabricated by a film forming method that involves applying a liquid material on a substrate, management of film thickness is cumbersome and in addition, the resin applied on the substrate is still liquid before curing, so the resin will flow on the substrate to make it difficult to maintain uniformity of film thickness. Thus, there are many problems arising from the fact that the form of the material is liquid.

Further, the upper cladding after the core has been embedded must have flatness taking into consideration of subsequent mounting of light receiving or emitting devices. However, when liquid waveguide materials are used for the upper cladding, there tends to occur unevenness as a result of following up the ridge pattern of the core, so it is difficult to realize flatness.

The epoxy resins have problems similar to those of the above-mentioned waveguide materials including deuterized silicone resins or fluorinated polyimides because the epoxy resins are liquid.

That is, heretofore, epoxy resins for forming optical waveguides are those epoxy resins that are liquid at room temperature, or solid epoxy resins diluted with solvents have been used. These epoxy resins have excellent transparency and heat resistance at about 200 to 280° C. However, since an epoxy resin is used for fabricating optical waveguides by applying a liquid material on a substrate and forming a film by, for example, a spin coating method, management of film thickness is cumbersome and in addition, the resin applied on the substrate is still liquid before curing, so the resin will flow on the substrate to make it difficult to maintain uniformity of film thickness. Thus, there are many problems arising from the fact that the form of the material is liquid.

Further, the epoxy resin is capable of forming core patterns by an exposure to light and development method by addition of an optical polymerization initiator and is reported to have a high transparency of 0.1 dB/cm. However, the epoxy resins generally have heat resistance of 200 to 280° C. and to obtain high reliability, they are required to have still higher heat resistance although some of them are applicable to the above-mentioned optical/electronic board.

As mentioned above, none of the conventional resins for forming optical waveguides has in combination (1) high transparency, (2) high heat resistance, (3) high-precision film formability, and (4) acceptable productivity.

Further, in high speed, high-density signal transmission, between electronic devices or printed wiring boards, transmission through the conventional electric wiring is approaching to a limit of attaining high speed and high density due to restrictions of mutual interference and attenuation of signals. To break through such restrictions, the technology of connecting electronic devices and printed wiring boards to each other by means of light, so-called optical interconnection is being studied. As the light path, flexible optical waveguides having flexibility are considered to be suitable from the viewpoints of ease of connection to devices and substrates and ease of handling.

Flexible optical waveguides include polymer film optical waveguides described in, for example, Patent Document 3. Polymer films are formed as follows. A solution of a polymer or the like is applied on a substrate such as silicon by spin coating and is baked to form a lower cladding layer. In the same manner, a core layer is formed and then a mask pattern is formed with, for example, a Si-containing photoresist and dry-etched to form a core pattern. After that, an upper cladding layer is formed in the same manner as that in which the lower cladding layer is formed. Finally, the resultant optical waveguide is peeled from the substrate to fabricate a film-made optical waveguide. In particular, to make it easy to peel the optical waveguide, there is shown a method in which a thermally oxidized silicon substrate is used as the substrate and after the formation of the optical waveguide, the substrate having the optical waveguide thereon is immersed in hydrofluoric acid to separate the optical waveguide.

However, in the case of the above-mentioned film optical waveguide, each of the lower cladding, core, and upper cladding layers is formed by spin coating and baking. This method takes much time for forming each layer and in addition has problems arising from the fact that the form of the material is liquid. That is, since optical waveguides are fabricated by a film forming method that involves applying a liquid material on a substrate, management of film thickness is cumbersome and in addition, the resin applied on the substrate is still liquid before curing, so the resin will flow on the substrate to make it difficult to maintain uniformity of film thickness. Also, the method is not suitable for mass production of optical waveguides having a size of 10 cm or more because of use of silicon for substrates.

Further, the above-mentioned production method involves a step of dry etching, which is a high vacuum process, so dry etching must be performed for a very long period of time to fabricate multi-mode optical waveguides having a thick core layer.

Patent Document 1: Japanese Patent No. 3085666
Patent Document 2: Japanese Patent Application Laid-Open No. 6-228274
Patent Document 3: Japanese Patent Application Laid-Open No. 7-239422
Non-patent Document 1: Journal of Japan Institute of Electronics Packaging, Vol. 7, No. 3, pp. 213-218, 2004
Non-patent Document 2: IEEE Journal of Lightwave Technology, Vol. 16, pp. 1049-1055, 1998
Non-patent Document 3: Optics ("Kogaku"), vol. 3, No. 2, pp. 81-83, 2002

DISCLOSURE OF THE INVENTION

In view of the above-mentioned problems, it is an object of the present invention to provide a resin composition for an optical material that allows formation of a thick film having high transparency, high heat resistance, and high precision and has high productivity and that is particularly useful for resin films for forming optical waveguides, a resin film for an optical material using such a resin composition, and an optical waveguide using such a film. It is another object of the present invention to provide a flexible optical waveguide having high flexibility and toughness and in addition having excellent productivity and a method of producing the same.

The inventors of the present invention have made extensive studies and as a result, they have found that the above-mentioned objects can be achieved by using specified photopolymerizable compounds and by using a resin composition containing a base polymer, a photopolymerizable compound, and a polymerization initiator.

That is, the present invention relates to the following.
(1) A resin composition for an optical material, including:
(A) a base polymer;
(B) a photopolymerizable compound; and
(C) a photopolymerization initiator.
(2) A resin composition for an optical material, including:
(B) a photopolymerizable compound that is fluorene di(meth)acrylate represented by the following general formula (I); and
(C) a photopolymerization initiator,

[Chem 1]

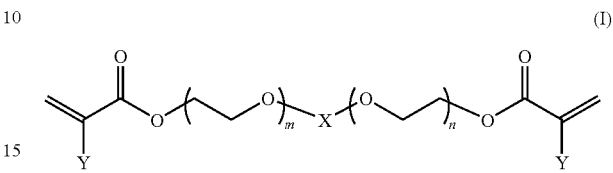

wherein X is represented by the following formula (II); Y is hydrogen or a methyl group; and m and n are each an integer of 1 to 20;

[Chem 2]

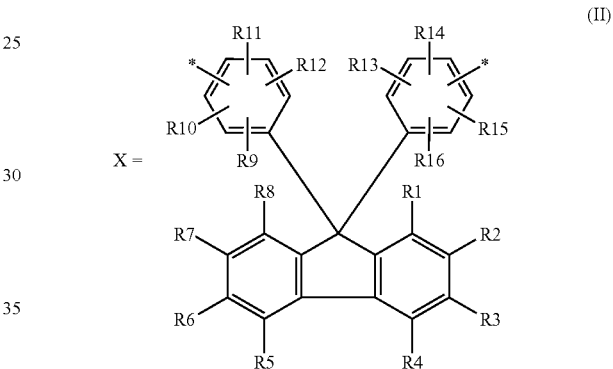

wherein R1 to R16 independently represent hydrogen, an alkyl group having 1 to 12 carbon atoms, an alkoxy group having 1 to 6 carbon atoms, an alkoxycarbonyl group having 2 to 7 total carbon atoms, an aryl group having 6 to 10 carbon atoms, or an aralkyl group having 7 to 9 carbon atoms.

(3) A resin composition for an optical material according to Item (1), in which the photopolymerizable compound (B) has an ethylenically unsaturated group in a molecule thereof.
(4) A resin composition for an optical material according to Item (3), in which the photopolymerizable compound (B) is epoxy(meth)acrylate or acryl (meth)acrylate.
(5) A resin composition for an optical material according to Item (3), in which the component (B) contains fluorene di(meth)acrylate represented by the following general formula (I):

[Chem 3]

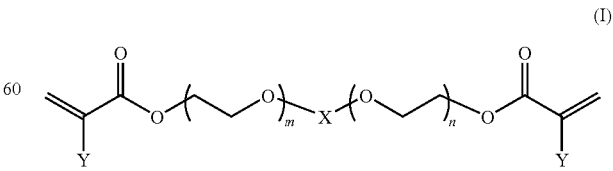

wherein X is represented by the following formula (II); Y is hydrogen or a methyl group; and m and n are each an integer of 1 to 20;

[Chem 4]

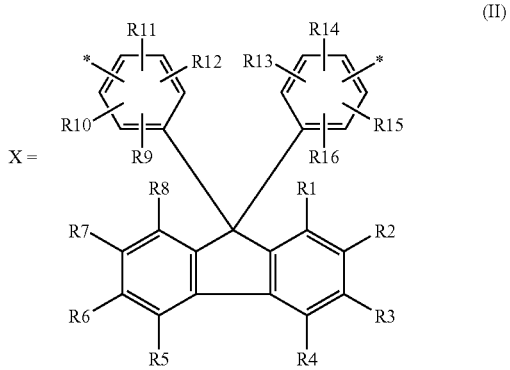

wherein R1 to R16 independently represent hydrogen, an alkyl group having 1 to 12 carbon atoms, an alkoxy group having 1 to 6 carbon atoms, an alkoxycarbonyl group having 2 to 7 carbon atoms, an aryl group having 6 to 10 carbon atoms, or an aralkyl group having 7 to 9 carbon atoms.

(6) A resin composition for an optical material according to Item (3), wherein the component (B) contains (meth)acrylate represented by the following general formula (III):

[Chem 5]

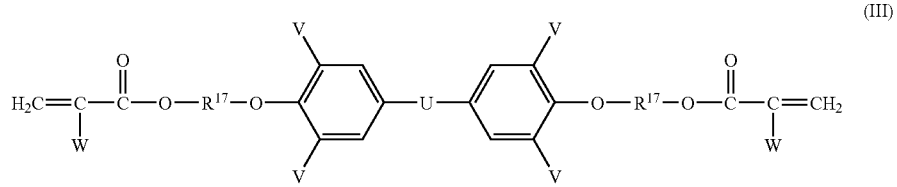

wherein $R^{17}$ is —$CH_2CH(OH)CH_2$—, —$(C_2H_4O)_hC_2H_4$—, —$(C_3H_6O)_iC_3H_6$—, or —$(C_2H_4O)_j$—$(C_3H_6O)_kC_3H_6$—; U is —$C(CH_3)_2$—, —$CH_2$—, —$SO_2$—, or —O—; V is hydrogen or halogen; and W is hydrogen or —$CH_3$, provided that h, i, j, and k are each an integer of 0 to 10.

(7) A resin composition for an optical material according to Item (1), wherein the resin composition contains as the component (B) a compound having 2 or more epoxy groups in a molecule thereof.

(8) A resin composition for an optical material according to any one of Items (1) and (3) to (7), wherein the base polymer (A) has a number average molecular weight of 5,000 or more.

(9) A resin composition for an optical material according to any one of Items (1) and (3) to (8), wherein the base polymer (A) has an aromatic skeleton in a main chain thereof.

(10) A resin composition for an optical material according to Item (9), wherein the base polymer (A) includes as structural units of the copolymer components:

(a-1) at least one member selected from the group consisting of bisphenol A, a bisphenol A type epoxy compound, and derivatives thereof; and (a-2) at least one member selected from the group consisting of bisphenol F, a bisphenol F type epoxy compound, and derivatives thereof.

(11) A resin composition for an optical material according to Item (9), wherein the base polymer (A) includes a phenoxy resin.

(12) A resin composition for an optical material according to any one of Items (1) and (3) to (8), wherein the base polymer (A) includes an epoxy resin that is solid at room temperature.

(13) A resin composition for an optical material according to any one of Items (1) and (3) to (12), wherein:

the content of the component (A) is 5 to 80 mass % and the content of the component (B) is 20 to 95 mass % with respect to a total content of the components (A) and (B); and the content of the component (C) is 0.1 to 10 mass parts with respect to 100 mass parts of the components (A) and (B) in total.

(14) A resin composition for an optical material according to Item (13), wherein the content of the component (A) is 10 to 80 mass % and the content of the component (B) is 20 to 90 mass % with respect to a total content of the components (A) and (B).

(15) A resin composition for an optical material according to any one of Items (1) to (14), wherein the content of the component (B) is 90 to 99.9 mass % and the content of the component (C) is 0.1 to 10 mass % with respect to a total mass of the components (B) and (C).

(16) A resin film for an optical material, including the resin composition according to any one of Items (1) and (3) to (15).

(17) A resin film for an optical material according to Item (16), wherein the resin film for an optical material is a resin film for forming optical waveguides, and a cured product of the film has an optical transmission loss of 0.5 dB/cm or less.

(18) An optical waveguide, including the resin film for an optical material according to Item (17) as at least one of a lower cladding, a core, and an upper cladding of the optical waveguide.

(19) A method of fabricating an optical waveguide, including:

a first step of laminating a resin film for an optical material on a substrate to form a lower cladding layer;

a second step of laminating a resin film for an optical material having a refractive index higher than that of the lower cladding layer on the lower cladding layer to form a core layer;

a third step of exposing the core layer to light to develop the core layer to form a core pattern of an optical waveguide; and a fourth step of laminating a resin film for an optical material having a refractive index lower than that of the core layer to form an upper cladding layer, wherein at least one of the resin films for optical materials used in the first step, the second step, and the fourth step is the resin film for an optical material according to Item (16) or (17).

(20) A flexible optical waveguide, including one resin film for forming a core layer and two resin films for forming a cladding layer, wherein at least one of the resin films for forming a cladding layer is composed of a resin for forming a cladding layer and a base material film, and the base material film is arranged on an outer side of the cladding layer with respect to the core layer.

(21) A flexible optical waveguide according to Item (20), wherein the resin films for forming a cladding layer each include a base material film subjected to adhesion treatment and a film of the resin for forming a cladding layer formed on the base material film.

(22) A flexible optical waveguide according to Item (20) or (21), wherein at least one of the resin film for forming a core layer and the two resin films for forming a cladding layer is the resin film for an optical material according to Item (17).

(23) A method of fabricating a flexible optical waveguide, including:

a first step of curing a cladding layer in a resin film for forming a cladding layer composed of the resin for forming a cladding layer and a base material film to form a cladding layer;

a second step of laminating a resin film for forming a core layer on the cladding layer to laminate a core layer;

a third step of exposing the core layer to light to develop to form a core pattern of an optical waveguide; and a fourth step of laminating a resin film for forming a cladding layer on the core pattern and curing the resin for forming a cladding layer.

(24) A method of fabricating a flexible optical waveguide according to Item (23), wherein the resin film for forming a cladding layer includes a base material film subjected to adhesion treatment and a film of the resin for forming a cladding layer formed on the base material film.

(25) A method of fabricating an optical waveguide according to Item (23) or (24), wherein at least one of the resin film for forming a core layer and the two resin films for forming a cladding layer is the resin film for an optical material according to Item (17).

The resin composition for an optical material of the present invention has high transparency and high heat resistance. The resin film for an optical material including the composition has high transparency and high heat resistance and allows for high-precision formation of a thick film. Further, use of the resin film for an optical material enables production of optical waveguides having excellent performance with high productivity.

DESCRIPTION OF SYMBOLS

Figure 1:
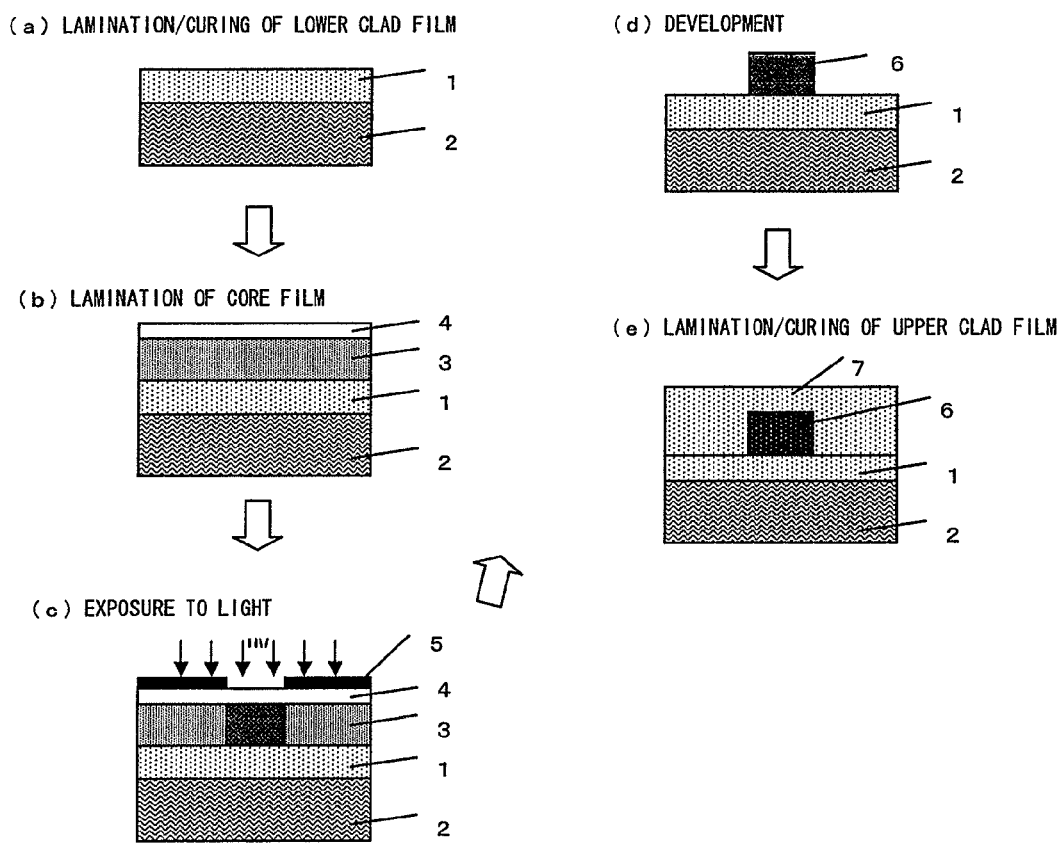
FIG. 1 is a schematic diagram illustrating the process of forming an optical waveguide pattern.

1; lower cladding layer
2; substrate
3; core layer
4; base material (for forming a core layer)
5; photo mask
6; core pattern
7; upper cladding layer
8; base material film (for forming a cladding layer)
9; lower cladding layer
10; core layer
11; base material (for forming a core layer)
12; photo mask
13; core pattern
14; upper cladding layer
15; base material film (for forming a cladding layer)

BEST MODE FOR CARRYING OUT THE INVENTION

The resin composition for an optical material of the present invention is a resin composition that includes (A) a base polymer, (B) a photopolymerizable compound, and (C) a photopolymerization initiator. Alternatively, the resin composition for an optical material of the present invention is a resin composition that includes a fluorene di(meth)acrylate as the photopolymerizable compound (B) and the photopolymerization initiator (C).

The base polymer (A) as used herein is to ensure strength of a cured product such as a film when such a cured product is formed and is not particularly limited as far as it can achieve such an object. Examples of the base polymer (A) include phenoxy resins, epoxy resins, (meth)acrylic resins, polycarbonate resins, polyallylate resins, polyether amides, polyether imides, polyether sulfones, and derivatives thereof. The base polymers may be used singly or two or more of them may be used as admixtures.

Among the base polymers exemplified as mentioned above, those having aromatic skeleton in the main chain are preferable, in particular, phenoxy resins are preferable, from the viewpoint of high heat resistance. Further, from the viewpoint of being capable of being three-dimensionally cross-linked to increase heat resistance, epoxy resins, in particular, epoxy resins that are solid at room temperature are preferable.

Further, when the resin composition of the present invention is used to form films, it is important to ensure transparency of the film. For this purpose, the base polymer must have high compatibility with the photopolymerizable compound (B) described in detail hereinbelow. From this point of view, the above-mentioned phenoxy resins and (meth)acrylic resins are preferable. Note that the (meth)acrylic resin as used herein refers to acrylic resins and methacrylic resins.

The phenoxy resin is an amorphous polymer and generally represented by the following general formula (IV).

[Chem 6]

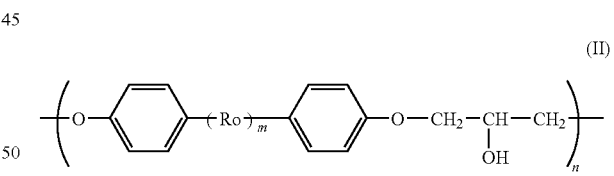

(II)

Here, n is an integer of 1 or more; m is 0 or 1; and —$R_0$— is a group represented by the following general formula (V), (VI), or (VII), or —O—.

[Chem 7]

(V)

-continued

[Chem 8]

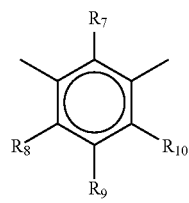

(VI)

[Chem 9]

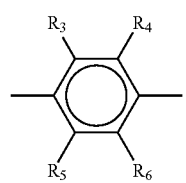

(VII)

Here, $R_1$ to $R_{10}$ are independently H, or an organic group represented by $CH_3$, $CF_3$, or the like.

Among the above-mentioned phenoxy resins, a straight chain polymer of a bisphenol A type epoxy resin having a repeating unit represented by the following formula (VIII) has high heat resistance and hence is preferable.

[Chem 10]

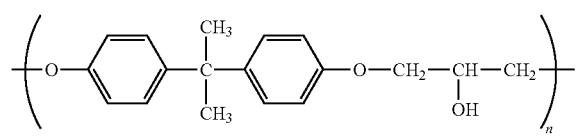

(VIII)

The phenoxy resin of the above-mentioned straight chain polymer generally is prepared by a one-step method in which bisphenol A and epichlorohydrin are subjected to polycondensation reaction or a two-step method in which a low molecular epoxy resin and bisphenol A are subjected to polyaddition reaction. Specific examples of the phenoxy resin include "YP-50" (trade name) manufactured by Tohto Kasei Co., Ltd., and those described in Japanese Patent Application Laid-Open No. 4-120124, Japanese Patent Application Laid-Open No. 4-122714, and Japanese Patent Application Laid-Open No. 4-339852.

Further, in addition to the phenoxy resins represented by the above-mentioned general formula (IV), polymers obtained by polyaddition reaction between various bifunctional epoxy resins and bisphenols, for example, brominated phenoxy resins (Japanese Patent Application Laid-Open No. 63-191826, JP-B-8-26119), bisphenol A/bisphenol F copolymer type phenoxy resins (Japanese Patent No. 2917884, Japanese Patent No. 2799401), phosphorus-containing phenoxy resins (Japanese Patent Application Laid-Open No. 2001-310939), high heat-resistance phenoxy resins having introduced therein a fluorene skeleton (Japanese Patent Application Laid-Open No. 11-269264, Japanese Patent Application Laid-Open No. 11-302373), and so on are known as phenoxy resins.

The phenoxy resins mentioned below represented by the above-mentioned bisphenol A/bisphenol F copolymer type phenoxy resins are suitable as the component (A) of the present invention. That is, the phenoxy resin contains as structural units of the copolymer components (a-1) at least one member selected from the group consisting of bisphenol A, a bisphenol A type epoxy compound, and derivatives thereof, and (a-2) at least one member selected from the group consisting of bisphenol F, a bisphenol F type epoxy compound, and derivatives thereof.

The resin film for an optical material made of a resin composition that includes a resin having the components (a-1) and (a-2) as the copolymerizable components is particularly suitable as a resin film for forming an optical waveguide. Use of it can increase interlayer adhesion of a cladding and a core and pattern formability (thin line or narrow space responsiveness) at the time of formation of the core pattern of an optical waveguide so that fine pattern formation having small line and space is possible.

Suitable examples of the bisphenol A or a bisphenol A type epoxy compound or derivatives thereof include tetrabromobisphenol A and a tetrabromobisphenol A type epoxy compound. Further, suitable examples of the bisphenol F or a bisphenol F type epoxy compound and derivatives thereof include tetrabromobisphenol F and a tetrabromobisphenol F type epoxy compound.

The base polymer (A) of the present invention includes particularly preferably a bisphenol A/bisphenol F copolymer type phenoxy resin as mentioned above, which is available, for example, as "Phenototo YP-70" (trade name) manufactured by Tohto Kasei Co., Ltd.

Then, the epoxy resin that is solid at room temperature includes bisphenol A type epoxy resins, for example, "Epototo YD-7020, Epototo YD-7019, Epototo YD-7017" (trade names) manufactured by Tohto Kasei Co., Ltd. and "Epikote 1010, Epikote 1009, Epikote 1008" (trade names) manufactured by Japan Epoxy Resins Co., Ltd.

The molecular weight of the base polymer (A) is preferably 5,000 or more, more preferably 10,000 or more, and particularly preferably 30,000 or more in terms of number average molecular weight in order to make it possible to form even a thick film of about 50 μm as required for optical waveguides for optical signal transmission between boards or in a board in routers or server devices. There is no particular upper limit of the molecular weight but from the viewpoints of compatibility with the photopolymerizable compound (B) or the exposure to light and developability, the molecular weight of the base polymer is preferably 1,000,000 or less, more preferably 500,000 or less, and particularly preferably 200,000 or less. Note that the number average molecular weight in the present invention is a value determined by measurement by gel permeation chromatography (GPC) and calculation in terms of standard polystyrene.

The blending amount of the base polymer (A) is preferably 5 to 80 mass % with respect to the total mass of the components (A) and (B). When the blending amount of the base polymer (A) is 5 mass % or more, it is easy to form films of the resin composition that contains the photopolymerizable compound and photopolymerization initiator. In particular, the blending amount of 10 mass % or more is preferable since even a thick film having a film thickness of 50 μm or more can be readily prepared upon film formation.

On the other hand, when the component (A) is in an amount of 80 mass % or less, the pattern formability of the resin composition increases and photocuring reaction proceeds sufficiently upon formation of optical waveguides. From these viewpoints, the blending amount of the base polymer (A) is set to more preferably 20 to 70 mass %.

Then, the photopolymerizable compound (B) in the present invention is not particularly limited as far as it can polymerize by irradiation of light such as ultraviolet ray.

However, from the reactivity with light, it is preferable that the photopolymerizable compound (B) be a compound that has an ethylenically unsaturated group in the molecule. Specific examples thereof include (meth)acrylates, vinylidene halides, vinyl ether, vinylpyridine, and vinylphenol. Among these, (meth)acrylates are preferable from the viewpoints of transparency and heat resistance.

(Meth)acrylates may be any of monofunctional, bifunctional, and trifunctional ones.

Note that "(meth)acrylate" as used herein refers to acrylates and methacrylates.

Examples of the monofunctional (meth)acrylate include methoxypolyethylene glycol(meth)acrylate, phenoxypolyethylene glycol(meth)acrylate, lauryl(meth)acrylate, isostearyl(meth)acrylate, 2-(meth)acryloyloxyethyl succinate, preferable that at least one bifunctional or higher functional polymerizable compound be used as the component (B).

Among the above-mentioned examples of the component (B), epoxy(meth)acrylate is a compound that is suitable for obtaining both transparency and heat resistance simultaneously and it is preferable that this compound be used in the present invention. Representative examples of epoxy(meth)acrylates include bisphenol A epoxyacrylate represented by the following formula (IX). Bisphenol A epoxyacrylate has excellent compatibility with a phenoxy resin and can realize high transparency, so it is a very preferable embodiment to use a phenoxy resin as the component (A) and bisphenol A epoxyacrylate as the component (B).

Note that bisphenol A epoxyacrylate is commercially available as EA-1020 (trade name, manufactured by Shin-Nakamura Chemical Co., Ltd.).

[Chem 11]

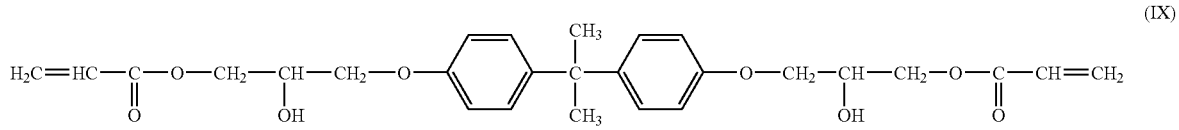

(IX)

paracumylphenoxyethylene glycol(meth)acrylate, 2-tetrahydropyranyl(meth)acrylate, isobornyl(meth)acrylate, methyl(meth)acrylate, ethyl(meth)acrylate, butyl(meth)acrylate, and benzyl(meth)acrylate.

Further, examples of the bifunctional (meth) acrylates include ethoxylated 2-methyl-1,3-propanediol di(meth)acrylate, neopentyl glycol di(meth)acrylate, 1,6-hexanediol di(meth)acrylate, 2-methyl-1,8-octanediol di(meth)acrylate, 1,9-nonanediol di(meth)acrylate, 1,10-nonanediol di(meth)acrylate, ethoxylated polypropylene glycol di(meth)acrylate, propoxylated ethoxylated bisphenol A diacrylate, ethylene glycol di(meth)acrylate, triethylene glycol di(meth)acrylate, tetraethylene glycol di(meth)acrylate, polyethylene glycol di(meth)acrylate, polypropylene glycol di(meth)acrylate, ethoxylated bisphenol A di(meth)acrylate, tricyclodecane di(meth)acrylate, ethoxylated cyclohexane dimethanol di(meth)acrylate, 2-hydroxy-1-acryloxy-3-methacryloxypropane, 2-hydroxy-1,3-dimethacryloxypropane, 9,9-bis[4[(2-acryloyloxyethoxy)phenyl]fluorene, 9,9-bis(3-phenyl-4-acryloylpolyoxyethoxy)fluorene, bisphenol A type, phenol novolak type, cresol novolak type, and glycidyl ether type epoxy(meth)acrylates.

Further, examples of the trifunctional or higher functional (meth)acrylates include ethoxylated isocyanuric acid tri(meth)acrylate, ethoxylated glycerol tri(meth)acrylate, trimethylolpropane tri(meth)acrylate, ethoxylated trimethylolpropane tri(meth)acrylate, pentaerythritol tri(meth)acrylate, pentaerythritol tetra(meth)acrylate, ethoxylated pentaerythritol tetra(meth)acrylate, propoxylated pentaerythritol tetra(meth)acrylate, ditrimethylolpropane tetra(meth)acrylate, caprolactone-modified ditrimethylolpropane tetra(meth)acrylate, and dipentaerythritol hexa(meth)acrylate. These may be used singly or two or more of them may be used in combination.

As the photopolymerizable compound (B), a single compound may be used alone or two or more compounds may be used in admixture. When the above-mentioned bifunctional or higher functional (meth)acrylates are used, the base polymer can be cured by being entangled in the three-dimensional network structure resulting by the polymerization, so it is Further, from the viewpoint of transparency, it is preferable to use acryl(meth)acrylate as the component (B). In particular, when a (meth)acrylic resin as the component (A) is combined therewith, the effect is markedly high. Acryl(meth)acrylate is not particularly limited and generally, it is a product of addition of a monofunctional (meth)acrylate to a polymer of glycidyl acrylate. Examples of the monofunctional (meth)acrylate include various ones, and for example, (meth)acrylic acid and compounds similar to those exemplified above as the monofunctional (meth)acrylate can be used.

When optical waveguides are formed using as a resin film for forming optical waveguides the resin film for an optical material made of the resin composition for an optical material of the present invention, a core film having a high refractive index and a cladding film having a low refractive index are required as described in detail hereinbelow. When the resin film for an optical material of the present invention is used as a core film, the photopolymerizable compound as the component (B) preferably contains fluorene di(meth)acrylate as a constituent taking into consideration high refractive index in addition to high transparency, high heat resistance, compatibility with the component (A). In particular, it is preferable that the photopolymerizable compound as the component (B) contain fluorene di(meth)acrylate represented by the following general formula (I) as a constituent.

[Chem 12]

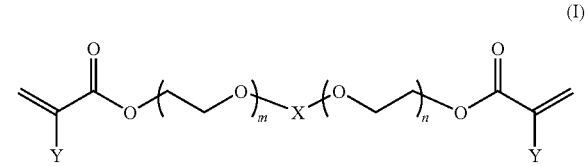

(I)

Here, X is represented by the following formula (II); Y is hydrogen or a methyl group; and m and n are each an integer of 1 to 20, preferably an integer of 1 to 10.

[Chem 13]

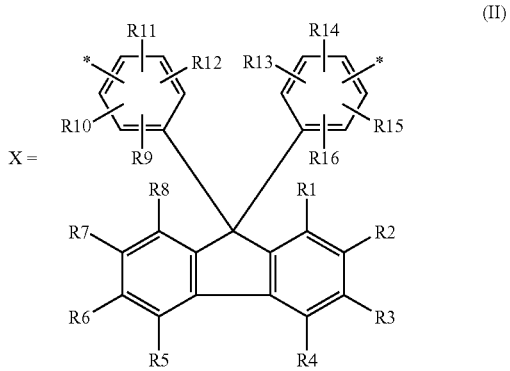

Here, R1 to R16 independently represent hydrogen, an alkyl group having 1 to 12 carbon atoms, an alkoxy group having 1 to 6 carbon atoms, an alkoxycarbonyl group having 2 to 7 carbon atoms, an aryl group having 6 to 10 carbon atoms, or an aralkyl group having 7 to 9 carbon atoms. R9 to R16 each may be present at any position of the benzene rings and, at portions where these substituents are absent ("*" marks in the formula (II)), the benzene rings are connected to oxygen in the skeleton of the formula (I). Note that those compounds of the general formulae (I) and (II) in which Y is hydrogen, R1 to R16 are each hydrogen, m is 1, and n is 1 are commercially available (trade name "A-BPEF", manufactured by Shin-Nakamura Chemical Co., Ltd.).

In addition, from similar viewpoints, (meth)acrylate represented by the following general formula (III) may be used as the film of a core material.

[Chem 14]

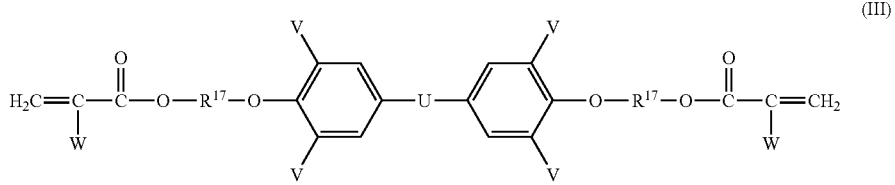

Here, $R^{17}$ is or —$CH_2CH(OH)CH_2$—, —$(C_2H_4O)_h$ $C_2H_4$—, —$(C_3H_6O)_i C_3H_6$—, or —$(C_2H_4O)_j$—$(C_3H_6O)_k$ $C_3H_6$—, U is —$C(CH_3)_2$—, —$CH_2$—, —$SO_2$—, or —O—, V is hydrogen or halogen, W is hydrogen or —$CH_3$. Further, h, i, j, and k are each an integer of 0 to 10. Among these, bisphenol A type epoxyacrylate in which $R^{17}$ is —$CH_2CH(OH)CH_2$—, U is —$C(CH_3)_2$—, V is hydrogen, and W is hydrogen is particularly preferable. This compound is commercially available (trade name "EA-1020", manufactured by Shin-Nakamura Chemical Co., Ltd.).

Note that, the above-mentioned fluorene di(meth)acrylate and a compound having at least one (meth)acryloyl group in the molecule can be used in combination as the component (B).

It is preferable that the photopolymerizable compound (B) in the present invention contain a compound having two or more epoxy groups in the molecule. Specific examples thereof include: bifunctional aromatic glycidyl ethers such as a bisphenol A type epoxy resin, a tetrabromobisphenol A type epoxy resin, a bisphenol F type epoxy resin, a bisphenol AD type epoxy resin, and a naphthalene type epoxy resin; polyfunctional aromatic glycidyl ethers such as a phenol novolak type epoxy resin, a cresol novolak type epoxy resin, a dicyclopentadiene-phenol type epoxy resin, and a tetraphenylolethane type epoxy resin; bifunctional aliphatic glycidyl ethers such as a polyethylene glycol type epoxy resin, a polypropylene glycol type epoxy resin, a neopentyl glycol type epoxy resin, and a hexanediol type epoxy resin; bifunctional alicyclic glycidyl ethers such as a hydrogenated bisphenol A type epoxy resin; polyfunctional aliphatic glycidyl ethers such as a trimethylolpropane type epoxy resin, a sorbitol type epoxy resin, and a glycerol type epoxy resin; bifunctional aromatic glycidyl esters such as diglycidyl phthalate; bifunctional alicyclic glycidyl esters such as diglycidyl tetrahydrophthalate and diglycidyl hexahydrophthalate; bifunctional aromatic glycidylamines such as N,N-diglycidylaniline and N,N-diglycidyltrifluoromethylaniline; polyfunctional aromatic glycidylamines such as N,N,N',N'-tetraglycidyl-4,4-diaminodiphenylmethane, 1,3-bis(N,N-glycidylaminomethyl)cyclohexane, and N,N,O-triglycidyl-p-aminophenol; bifunctional alicyclic epoxy resins such as alicyclic diepoxy acetal, alicyclic diepoxy adipate, alicyclic diepoxy carboxylate, and vinyl cyclohexene dioxide; bifunctional heterocyclic epoxy resins such as diglycidyl hydantoin; polyfunctional heterocyclic epoxy resins such as triglycidyl isocyanurate; and bifunctional or polyfunctional silicon-containing epoxy resins such as an organopolysiloxane type epoxy resin.

The compounds each having two or more epoxy groups in the molecule usually have a molecular weight on the order of 100 to 2,000, more preferably 150 to 1,000 and those which are liquid at room temperature are preferably used. These compounds may be used singly or two or more of them may be used in combination. Further, they can be used in combination with other photopolymerizable compounds. Note that the molecular weight of the photopolymerizable compound in the present invention can be measured by a GPC method or a mass spectrometric method.

The blending amount of the photopolymerizable compound (B) is preferably 20 to 95 mass % with respect to the total mass of the components (A) and (B). When the blending amount of the photopolymerizable compound (B) is 20 mass % or more, it is easy to cure the resin composition with the base polymer being entangled by the photopolymerizable compound (B). This is advantageous when optical waveguides are formed since pattern formability is increased. On the other hand, when the blending amount is 95 mass % or less, it is easy to form films by addition of the component (A). Further, from the viewpoint of easy formation of thick films, the blending amount is preferably 90 mass % or less. From the above-mentioned viewpoints, the blending amount of the photopolymerizable compound (B) is more preferably 30 to 80 mass %.

The photopolymerization initiator (C) in the present invention is not particularly limited. For example, initiators for fluorene di(meth)acrylates and (meth)acrylates include: aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butan-1-one, 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, and 1,2-methyl-1-[4-(methylthio)phenyl]-2-morpholinopropan-1-one; quinones such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether compounds such as benzoin methyl ether, benzoin ethyl ether, and benzoin phenyl ether; benzoin compounds such as benzoin, methylbenzoin, and ethylbenzoin; benzyl derivatives such as benzyl dimethyl ketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; phosphine oxides such as bis(2,4,6-trimethylbenzoyl)phenylphosphine oxide, bis(2,6-dimethoxybenzoyl)-2,4,4-trimethylpentylphosphine oxide, and 2,4,6-trimethylbenzoyldiphenylphosphine oxide; acridine derivatives such as 9-phenylacridine and 1,7-bis(9,9'-acridinyl)heptane; N-phenylglycine; N-phenylglycine derivatives; and coumarine compounds. Further, in the case of 2,4,5-triarylimidazole dimers, two 2,4,5-triarylimidazoles may have the same substituents on the aryl groups thereof to give a symmetric compound or may have different substituents on the aryl groups to give an asymmetric compound. Like the combination of diethylthioxanthone and dimethylaminobenzoic acid, thioxanthone compounds and tertiary amine compounds may be combined. These may be used singly or two or more of them may be used in combination.

Further, from the viewpoint of increasing transparency of the core layer and the cladding layer, aromatic ketones and phosphine oxides from among the above-mentioned compounds are preferable.

The initiator for the epoxy resin is not particularly limited and examples thereof include: aryldiazonium salts such as p-methoxybenzenediazonium hexafluorophosphate; diaryliodonium salts such as diphenyliodonium hexafluorophosphonium salt and diphenyliodonium hexafluoroantimonate; triarylsulfonium salts such as triphenylsulfonium hexafluorophosphonium salt, triphenylsulfonium hexafluoroantimonate salt, diphenyl-4-thiophenoxyphenylsulfonium hexafluoroantimonate, diphenyl-4-thiophenoxyphenylsulfonium hexafluoroantimonate, and diphenyl-4-thiophenoxyphenylsulfonium pentafluorohydroxyantimonate; triallylselenonium salts such as triphenylselenonium hexafluorophosphonium salt, triphenylselenonium borofluoride, and triphenylselenonium hexafluoroantimonate; dialkylphenazylsulfonium salts such as dimethylphenazylsulfonium hexafluoroantimonate and diethylphenazylsulfonium hexafluoroantimonate; dialkyl-4-hydroxyphenylsulfonium salts such as 4-hydroxyphenyldimethylsulfonium hexafluoroantimonate and 4-hydroxyphenylbenzylmethylsulfonium hexafluoroantimonate; and sulfonic acid esters such as α-hydroxymethylbenzoinsulfonates, N-hydroxyimidosulfonates, α-sulfonyloxyketone, and β-sulfonyloxyketone. These polymerization initiators may be used singly or two or more of them may be used in combination.

The blending amount of the photopolymerization initiator (C) is preferably 0.1 to 10 mass parts with respect to 100 mass parts of the total amount of the components (A) and (B). When the blending amount is 0.1 mass part or more, the photosensitivity of the resin composition is sufficient while when the blending amount is 10 mass parts or less, absorption on the surface layer of the photosensitive resin composition will not increase upon exposure to light, so sufficient photocuring occurs in the inside the resin composition. Further, when the resin composition is used as an optical waveguide, the blending amount is preferably within the above-mentioned range because transmission loss does not increase due to the influence of light absorption by the polymerization initiator itself. From the above-mentioned viewpoints, the blending amount of the photopolymerization initiator (C) is more preferably 0.2 to 5 mass parts.

Further, the content of the photopolymerization initiator (C) is preferably in the range of 0.1 to 10 mass % with respect to the total mass of the components (B) and (C). On the other hand, the content of the component (B) is in the range of preferably 90 to 99.9 mass %. When the content of the component (C) is 0.1 mass % or more, the photosensitivity of the resin composition is sufficient while when the content of the component (C) is 10 mass % or less, the surface of the optical waveguide is selectively cured, so cure will not be insufficient. Further, advantageously, transmission loss will not increase because of the absorption by the polymerization initiator itself. From the above-mentioned viewpoints, the content of the photopolymerization initiator (C) is more preferably 0.2 to 5 mass %.

Further, in addition to this, so-called additives such as inner releasing agents, antioxidants, yellowing preventing agents, ultraviolet absorbents, visible light absorbing agents, coloring agents, plasticizers, stabilizers, and fillers may be added to the resin composition for an optical material of the present invention as necessary, as far as the effects of the present invention are not adversely affected.

The resin film for an optical material of the present invention is made of the above-mentioned resin composition and when the film is used as an optical waveguide, it is preferable that the cured product of the resin composition have optical transmission loss of 0.5 dB/cm or less. Here, the optical transmission loss is based on values measured by a prism-coupler type optical characteristics measuring apparatus (SPA-4000, manufactured by SAIRON TECHNOLOGY, Inc.).

The resin film for an optical material of the present invention can be readily produced by dissolving the resin composition containing the components (A) to (C) in a solvent, applying the resultant on a substrate, and removing the solvent. The solvent used herein is not particularly limited as far as it can dissolve the resin composition. For example, solvents such as acetone, methyl ethyl ketone, methyl cellosolve, ethyl cellosolve, toluene, N,N-dimethylformamide, N,N-dimethylacetamide, and propylene glycol monomethyl ether and mixed solvents thereof can be used. The solid concentration in the resin solution is usually on the order of preferably 30 to 60 mass %.

The thickness of the resin film for an optical material of the present invention is not particularly limited and the thickness after drying is usually 10 μm to 100 μm. When the thickness of the film is 10 μm or more, the connection tolerance with light receiving or emitting devices or optical fibers can be advantageously expanded. On the other hand, when the thickness of the film is 100 μm or less, the connection efficiency with the light receiving or emitting devices or optical fibers can be advantageously increased. From the above-mentioned viewpoints, the thickness of the film is in the range of more preferably 30 μm to 70 μm.

Further, the thickness of the film that serves as a cladding of an optical waveguide is not particularly limited as far as it allows containment of light and embedding of the core. Usually, the thickness of the film is 20 to 200 μm.

Hereinafter, an application example in which the resin film for an optical material of the present invention is used as a resin film for forming an optical waveguide, which is the most preferable application, will be described in detail.

The base material used in the process of manufacturing the resin film for forming optical waveguides of the present invention is a support for supporting a film for forming optical waveguides, the material of which is not particularly limited. From the viewpoints of easy peeling of the film for forming optical waveguides and heat resistance and solvent resistance, polyesters such as polyethylene terephthalate, and polyolefins such as polypropylene and polyethylene are preferably exemplified. The thickness of the base material is in the range of preferably 5 to 50 μm. When the thickness of the base material is 5 μm or more, the strength of the support can be advantageously obtained while when the thickness of the film is 50 μm or less, the gap between the mask and the pattern upon patterning becomes small so that finer patterns can be advantageously formed. From the above-mentioned viewpoints, the thickness of the base material is in the range of more preferably 10 to 40 μm, further more preferably 15 to 30 μm, and particularly preferably 20 to 30 μm.

Further, to increase transmittance of light for exposure and reduce roughening of the side wall of the core pattern, it is preferable to use a flexible base material of high transparency type. A haze value of the base material of high transparency type is preferably 5% or less, more preferably 3% or less, and particularly preferably 2% or less. Note that the haze values can be measured according to JIS K7105 using, for example, a commercially available turbidity meter such as NDH-1001DP (manufactured by Nippon Denshoku Industries Co., Ltd.). Such a base material is available as "Cosmo Shine A1517" and "Cosmo Shine A4100" (trade names, manufactured by Toyobo Co., Ltd.).

The film for forming optical waveguides provided on the thus-obtained base material can be readily stored by winding in the form of, for example, a roll. Further, a protective film can be provided on the film for forming optical waveguides as necessary. Note that the base material and protective film may be subjected to antistatic treatment or the like for facilitating release of the film for forming optical waveguides in a later stage.

The resin film for forming optical waveguides of the present invention can be used as a lower cladding, a core, and an upper cladding of an optical waveguide and is preferably used in at least one of these.

Hereinafter, the production method of forming optical waveguides using the resin film will be described in detail. The method includes, for example, a method in which a lower cladding film released from the base material is removed of a protective film, if any, and is pressure-bonded to a substrate with heating to laminate it. Here, from the viewpoint of adhesion and followability, it is preferable that the lamination is performed under reduced pressure. The heating temperature for the resin film is preferably 50 to 130° C. The pressure at which pressure bonding is performed is on the order of preferably 0.1 to 1.0 MPa (on the order of 1 to 10 kgf/cm$^2$). However, these conditions are not particularly limited. Then, the lower cladding film is cured by light or heat. A core film having a higher refractive index than that of the lower cladding film is laminated in a similar manner. The laminated resin film thus obtained is irradiated with actinic radiation through a negative or positive mask pattern called artwork so that the actinic radiation forms an image. The light source for actinic radiation includes known light sources that can effectively radiate ultraviolet ray, for example, a carbon arc lamp, a mercury vapor arc lamp, a super-high pressure mercury lamp, a high-pressure mercury lamp, and a Xenon lamp. Besides, those light sources that effectively radiate visible light such as a flood lamp for photography and a sunlight lamp can also be used.

Then, after exposure to light, wet development, dry development, or the like is performed to remove unexposed portions to produce a core pattern. In the case of wet development, a developer that has a composition corresponding to that of the above-mentioned resin film, such as an organic solvent, an alkaline aqueous solution, or a water-based developer is used to perform development by a known method, for example, by spraying, shaking immersion, brushing, scrubbing or the like.

As the developer, organic solvents, alkaline aqueous solutions, and the like that are safe and stable and user-friendly ones are preferably used. The above-mentioned organic solvent-based developers include, for example, 1,1,1-trichloroethane, N-methylpyrrolidone, N,N-dimethylformamide, N,N-dimethylacetamide, cyclohexanone, methyl isobutyl ketone, and γ-butyrolactone. The organic solvents may contain water in a range of 1 to 20 mass % to prevent catching fire.

The bases that can be used for the above-mentioned alkaline aqueous solution include, for example: alkali hydroxides such as hydroxides of lithium, sodium, or potassium; alkali carbonates such as carbonates or bicarbonates of lithium, sodium, potassium, or ammonium; alkali metal phosphates such as potassium phosphate, and sodium phosphate; and alkali metal pyrophosphates such as sodium pyrophosphate and potassium pyrophosphate. Examples of a preferable alkaline aqueous solution used for development include a dilute solution of 0.1 to 5 mass % sodium carbonate, a dilute solution of 0.1 to 5 mass % potassium carbonate, a dilute solution of 0.1 to 5 mass % sodium hydroxide, and a dilute solution of 0.1 to 5 mass % sodium tetraborate. Further, it is preferable that the alkaline aqueous solutions for development have a pH in the range of 9 to 11. The temperature of the alkaline aqueous solution is adjusted depending on the developability of the layer of the photosensitive resin composition. The alkaline aqueous solutions may contain surfactants, defoaming agents, a small amount of organic solvent for promoting development, and the like.

The above-mentioned aqueous developer includes water, or an alkaline aqueous solution and at least one organic solvent. The alkaline substances besides the above-mentioned substances include, for example, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine. The pH of the developer is as low as possible within the range where development of resist can be carried out sufficiently, and is preferably pH 8 to 12, more preferably pH 9 to 10. Example of the above-mentioned organic solvent include triacetone alcohol, acetone, ethyl acetate, alkoxyethanol having an alkoxy group containing 1 to 4 carbon atoms, ethyl alcohol, isopropyl alcohol, butyl alcohol, diethylene glycol monomethyl ether, diethylene glycol monoethyl ether, and diethylene glycol monobutyl ether. These can be used singly or two or more of them can be used in combination. Preferably, the concentration of the organic solvents is usually 2 to 90 mass % and the temperature of the organic solvent can be adjusted depending on the developability. Further, the aqueous developer may contain surfactants, defoaming agents, and so on in small amounts.

Further, two or more developing methods may be used in combination as necessary. The methods for development include, for example, a dipping method, a battle method, a spray method such as a high pressure spray method, brushing, and slapping.

As a treatment after the development, heating at about 60 to about 250° C. or exposure to light of about 0.1 to about 1,000 mJ/cm$^2$ may be performed as necessary to further cure the core pattern.

Then, an upper cladding film having a refractive index lower than that of the core film is laminated in the same manner as mentioned above to fabricate an optical waveguide.

Then, the flexible optical waveguide of the present invention is described. The flexible optical waveguide of the present invention is fabricated by using a resin film for forming a core layer having a high refractive index, two resin films for forming cladding layers having a low refractive index. The flexible optical waveguide of the present invention is characterized in that at least one of the resin films for forming cladding layers is constituted by a resin for forming a cladding layer and a base material film and the base material film is arranged outside the cladding layer with respect to the core layer. With this construction, a flexible optical waveguide to which flexibility and toughness of the base material film are imparted can be obtained. Also, use of film-shaped materials for forming optical waveguides enables to solve the problem of productivity and large area responsiveness specific to liquid materials. Further, the construction in which a base material film is arranged outside the cladding layer avoids exposure of the cladding layer to external environment, so the optical waveguide becomes less influenced by contamination or flaws to increase handleability.

While it is only necessary that the base material film arranged outside the cladding layer is provided on at least one side of the flexible optical waveguide, a flexible optical waveguide having less curling can be fabricated by adopting a symmetric structure in which the basic material film is provided on both sides of the optical waveguide.

The base material film for use in the resin film for forming a cladding layer used here is a support that imparts flexibility and toughness to the optical waveguide and its material is not particularly limited. From the viewpoint of flexibility and toughness, preferable examples of the material for the base material film include polyesters such as polyethylene terephthalate, polybutylene terephthalate, and polyethylene naphthalate, polyethylene, polypropylene, polyamide, polycarbonate, polyphenylene ether, polyether sulfide, polyallylate, liquid crystal polymer, polysulfone, polyether sulfone, polyether ether ketone, polyether imide, polyamideimide, and polyimide. The thickness of the base material film may vary depending on the desired flexibility as appropriate. Preferably, the thickness of the base material film is 5 µm to 250 µm. The thickness of 5 µm or more is advantageous in that toughness of the base material film can be easily obtained while the thickness of 250 µm or less provides sufficient flexibility.

Further, electric wiring may be provided on the base material film. In this case, a film having provided thereon an electric wiring in advance may be used as a base material film. Alternatively, after a flexible optical waveguide is produced, an electric wiring can be formed on the base material film thereof.

The resin film for forming the cladding layer preferably is prepared such that a film of the resin for forming a cladding layer is formed on a base material film that is subjected to adhesion treatment. This enhances the adhesion between the cladding layer and the base material film to prevent failure in peeling off. The "adhesion treatment" as used herein refers to a treatment for increasing adhesion force between the base material film and the cladding layer resin formed thereon by adhesion promoting resin coating, corona treatment, matte processing such as sandblasting, or the like.

The resin for forming a cladding layer is not limited particularly as far as it is a resin composition that has a lower refractive index than that of the core layer and is cured by light or heat. Thermosetting resin compositions and photosensitive resin compositions may be used.

More preferably, the resin for forming a cladding layer is constituted by a resin composition that includes (A) a base polymer, (B) a photopolymerizable compound, and (C) a photopolymerization initiator. Note that, the components (A), (B), and (C) are as described above.

The resin film for forming a cladding layer can be prepared without difficulty by dissolving a resin composition containing the components (A) to (C) in a solvent, applying the resultant solution on the base material film, and removing the solvent. The solvent that can be used in the present invention is the same as that used in preparing the resin film for an optical material. Note that the solid concentration in a resin solution is preferably on the order of preferably 30 to 80 mass %.

The thickness of the cladding layer after drying is in a range of preferably 5 µm to 500 µm. The thickness of 5 µm or more ensures sufficient thickness of cladding that is necessary for containment of light and the thickness of 500 µm or less makes it easy to uniformly control the film thickness. From the above-mentioned viewpoint, the thickness of the cladding layer is in a range of more preferably 10 µm to 100 µm.

Further, the thickness of the cladding layer is as follows. That is, the lower cladding layer that is formed first and the upper cladding layer that is provided to embed the core pattern therein may have the same thickness or different thicknesses from one another. However, it is preferable that the thickness of the upper cladding layer be made larger than the thickness of the core layer in order to embed the core pattern in the upper cladding layer.

The resin film for forming a core layer used in the present invention is designed so that the core layer has a higher refractive index than that of the cladding layer, and a resin composition that can form a core pattern with actinic radiation can be used to prepare the resin film for forming a core layer. A photosensitive resin composition is suitable for this purpose. Specifically, it is preferable that the same resin composition as that used for forming the cladding layer be used. That is, a resin composition that contains the above-mentioned components (A), (B), and (C) and in addition the above-mentioned optional components as necessary is preferable.

The resin film for forming a core layer can be prepared without difficulty by dissolving a resin composition containing the components (A) to (C) in a solvent, applying the resultant solution on the base material film, and removing the solvent. The solvent that can be used here is the same as that used in preparing the resin film for an optical material. The solid concentration in the resin solution is on the order of preferably 30 to 80 mass %.

The thickness of the resin film for an optical material of the present invention is not particularly limited and the thickness after drying is usually 10 μm to 100 μm. When the thickness of the film is 10 μm or more, the tolerance in alignment when connection is made to light receiving or emitting devices or optical fibers after the optical waveguide is formed can be advantageously expanded. On the other hand, when the thickness of the film is 100 μm or less, the connection coefficient with the light receiving or emitting devices or optical fibers after can be advantageously increased. From the above-mentioned viewpoints, the thickness of the film is in the range of preferably 30 μm to 70 μm.

The base material used in the manufacturing process of the resin film for forming a core layer is a support that supports the film for forming optical waveguides and is not limited particularly on the material and may be the same as those described above as the base material used in the manufacturing process of the resin film for forming optical waveguides.

Hereinafter, the method of producing a flexible optical waveguide according to the present invention is explained in detail.

First, in a first step, a cladding layer is formed by curing a resin for forming a cladding layer in a resin film for forming a cladding layer, the resin film being constituted by the resin for forming a cladding layer and a base material film. In the first step of forming a cladding layer, in case where a protective film is provided on a side opposite to the base material film in the resin film for forming a cladding layer, the resin film for forming a cladding layer is cured with light or heating after the protective layer is peeled off.

Then, in a second step, a resin film for forming a core layer is laminated on the cladding layer to laminate a core layer. In the second step, the resin film for forming a core layer is pressure bonded with heating on the above-mentioned cladding layer to laminate a core layer having refractive index larger than that of a cladding layer. Here, from the viewpoint of adhesion and followability, it is preferable that the lamination be performed under reduced pressure. The heating temperature used here is preferably set to 50 to 130° C. and the pressure of the pressure bonding is preferably set to about 0.1 to about 1.0 MPa (1 to 10 kgf/cm$^2$). However, these conditions are not particularly limited. The resin film for forming a core layer is easy to handle and thus is preferable if it is constituted by a core layer and a base material and it may consist of a core layer alone.

Then, in a third step, the core layer is exposed to light and developed to form a core pattern of an optical waveguide. Specifically, actinic radiation is imagewise irradiated to the core layer through a negative mask pattern. The light source for actinic radiation includes known light sources that can effectively radiate ultraviolet ray, for example, a carbon arc lamp, mercury vapor arc lamp, a super-high pressure mercury lamp, a high-pressure mercury lamp, and a Xenon lamp. Besides, those light sources that effectively radiate visible light such as a flood lamp for photography and a sunlight lamp can also be used.

Then, in case where the base material of the resin film for forming a core layer remains, the base material is peeled off and then unexposed portions are removed by wet development or the like to effect development, thus forming a waveguide pattern. In the case of wet development, a developer that has a composition corresponding to that of the above-mentioned resin film, such as an organic solvent is used to perform development, for example, by spraying, shaking immersion, brushing, scrubbing or the like known method.

The organic solvent developer, developing method, and treatment after development are the same as those mentioned above.

After that, a fourth step is performed, which includes laminating a resin film for forming a cladding layer for embedding therein a core pattern and curing the film. The lamination is performed such that in case the resin film for forming a cladding layer includes a resin for forming a cladding layer and a base material film, the resin for forming a cladding layer is arranged on the side of the core pattern. In this case, the thickness of the cladding layer is preferably made larger than that of the core layer. Curing is performed by light or heat in the same manner as mentioned above.

The above-mentioned production method solves the conventional problem and greatly shortens the time of fabricating a multimode optical waveguide having a large core size.

The resin composition for an optical material that includes the components (B) and (C) can be obtained by dissolving the components (B) and (C) in a solvent. The solvent used here is not particularly limited as far as it can dissolve the resin composition. Examples of the solvent include N-methylpyrrolidone, N,N-dimethylformamide, N,N-dimethylacetamide, cyclohexanone, methyl ethyl ketone, methyl isobutyl ketone, γ-butyrolactone, methyl cellosolve, ethyl cellosolve, propylene glycol monomethyl ether, acetone, and toluene. Alternatively, mixed solvents thereof may be used.

The resin concentration in the resin solution is usually 30 to 80 mass %.

The resin composition for an optical material of the present invention that includes the components (B) and (C) is preferably used in at least one of the lower cladding, core and upper cladding of an optical waveguide.

Hereinafter, the method of fabricating an optical waveguide using the resin composition for an optical material of the present invention that includes the components (B) and (C) is explained. The method involves applying the resin composition on a substrate using, for example, a spin coating method, a dipping method, a spraying method, a curtain-coating method, a silk screen method, or a roll coating method, drying and removing the solvent by heating or drying under reduced pressure, and then curing the resin by irradiation of actinic radiation or by heating. The resin layer constitutes the cladding layer.

Then, by a similar coating method, a resin composition having a refractive index higher than that of the earlier formed optical waveguide layer is applied to form a core layer. Subsequently, actinic radiation is irradiated through a mask pattern of negative or positive type. After the exposure to light, unexposed portions are removed by wet development, dry development or the like to perform development, whereby a core pattern is produced. Here, the optical waveguide pattern may be further cured by heating it at about 60° C. to about 250° C. or performing exposure at an intensity of about 0.1 to about 1,000 mJ/cm$^2$ before it can be used.

After that, a resin having a refractive index lower than that of the core layer is applied to form a film in the same manner as mentioned above to fabricate an optical waveguide.

EXAMPLE

Then, the present invention will be described in detail by examples. However, the present invention is by no means limited by the examples.

Example 1

Epoxyacrylate oligomer (trade name "HITALLOID", manufactured by Hitachi Chemical Co., Ltd.) and phenoxy resin (trade name "YP-50", manufactured by Tohto Kasei Co., Ltd.) were blended in equivalent mass ratio (using 50 mass parts per 100 mass parts of total resin of methyl ethyl ketone as a solvent). To this was added a three-component optical radical generator consisting of an optical initiator (2,2-bis(2-chlorophenyl)-4,4',5,5'-tetraphenyl 1,2'-biimidazole manufactured by Tokyo Chemical Industry Co., Ltd.; 4,4'-bis(diethylamino)benzophenone manufactured by Tokyo Chemical Industry Co., Ltd., and 2-mercaptobenzimidazole manufactured by Tokyo Chemical Industry Co., Ltd.) in an amount of 2 mass parts based on 98 mass parts of total resin to provide a resin composition for forming an optical waveguide. This was applied on a PET film ("A4100", manufactured by Toyobo Co., Ltd.) using an applicator ("YBA-4", manufactured by Yoshimitsu Seiki Co., Ltd.) and dried under conditions of 80° C. for 10 minutes and then 100° C. for 10 minutes to evaporate the solvent, thereby obtaining a resin film for optical waveguides. The thickness of the film could be adjusted between 5 μm and 100 μm by controlling the gap in the applicator. In this example, the thickness of the film was adjusted to 12 μm.

The resin film for forming optical waveguides was laminated on a silicon wafer (thickness 1 μm) with a thermal oxidation film (thickness 1 μm) using a vacuum pressure laminator (MVLP-500, manufactured by Meiki Co., Ltd.) under conditions of a pressure of 0.4 MPa and a temperature of 60° C. To this was irradiated ultraviolet ray at an intensity of 1 J/cm$^2$ from a metal halide lamp ("Eye Dolphin 3000", manufactured by Eye Graphics Co., Ltd.) to optically cure the resin. After the PET film was peeled off, the resin was post-baked under conditions of 160° C. for 1 hour, thereby obtaining a slab optical waveguide (core thickness 12 μm). The refractive index of the obtained optical waveguide (core) was measured using a prism coupler (Model 2020) manufactured by Metricon Corporation (measuring wavelength 830 nm). The refractive index obtained was 1.583 for both TE polarized light and TM polarized light. The slab optical waveguide was passed through a solder reflow oven ("Salamander", manufactured by Furukawa Electric Co., Ltd.) three times under conditions of maximum temperature of 265° C. (retention time of 15 to 20 seconds at 260° C. or more) and nitrogen atmosphere.

Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.60). As a result, the transmission losses before and after reflow were found to be 0.2 dB/cm and 0.3 dB/cm, respectively. This indicates that the resin film for forming optical waveguides had high heat resistance and low loss. Note that in the present example, the thermal oxidation film served as a lower cladding and air served as an upper cladding.

Further, the gap of the applicator was changed and a 50 μm-thick resin film for forming optical waveguides was prepared in the same manner as described above. The film was exposed to light through a mask pattern and developed with N,N-dimethylacetamide (room temperature, 40 seconds, vibration shaking) to form a pattern. As a result, fabrication of an optical waveguide having a line width of 50 μm was confirmed.

Example 2

A resin film for forming optical waveguides was obtained in the same manner as that in Example 1 except that solid epoxy resin (trade name "Epototo YD-7020", manufactured by Tohto Kasei Co., Ltd.) was used in place of the phenoxy resin. The thickness of the film was 12 μm.

The resin film for forming optical waveguides was treated in the same manner as in Example 1 to obtain a slab optical waveguide (core thickness 12 μm). The refractive index of the slab optical waveguide (core) was measured in the same manner as in Example 1. As a result, the refractive index was 1.565 for both TE polarized light and TM polarized light. This was passed through a solder reflow oven ("Salamander", manufactured by Furukawa Electric Co., Ltd.) three times under conditions of a maximum temperature of 265° C. (retention time of 15 to 20 seconds at 260° C. or more) and nitrogen atmosphere.

Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.60). As a result, the transmission losses before and after reflow were found to be 0.2 dB/cm and 0.3 dB/cm, respectively. This indicates that the resin film for forming optical waveguides had high heat resistance and low loss.

Further, the gap of the applicator was changed and a 50 μm-thick resin film for forming optical waveguides was prepared in the same manner as above. The film was exposed to light through a mask pattern and developed with N,N-dimethylacetamide (room temperature, 40 seconds, vibration shaking) to form a pattern. As a result, fabrication of an optical waveguide having a line width of 50 μm was confirmed.

Example 3

A resin film for forming optical waveguides was obtained in the same manner as that in Example 1 except that acryl acrylate oligomer (trade name "HITALLOID 7975", manufactured by Hitachi Chemical Co., Ltd.) was used in place of epoxyacrylate oligomer, and acrylic resin (trade name "HTR-860P-3DR", manufactured by Teikoku Chemical Industries Co., Ltd.) was used in place of phenoxy resin. The thickness of the film was 12 μm.

The resin film for forming optical waveguides was treated in the same manner as in Example 1 to obtain a slab optical waveguide (core thickness 12 μm). The refractive index of the slab optical waveguide (core) was measured in the same manner as in Example 1. As a result, the refractive index was 1.505 for both TE polarized light and TM polarized light. This was passed through a solder reflow oven ("Salamander", manufactured by Furukawa Electric Co., Ltd.) three times under conditions of a maximum temperature of 265° C. (retention time of 15 to 20 seconds at 260° C. or more) and nitrogen atmosphere.

Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.56). As a result, the transmission losses before and after reflow were found to be 0.2 dB/cm and 0.3 dB/cm, respectively. This indicates that the resin film for forming optical waveguides had high heat resistance and low loss.

Further, the gap of the applicator was changed and a 50 μm-thick resin film for forming optical waveguides was prepared in the same manner as above. The film was exposed to light through a mask pattern and developed with N,N-dimethylacetamide (room temperature, 40 seconds, vibration shaking) to form a pattern. As a result, fabrication of an optical waveguide having a line width of 50 μm was confirmed.

Example 4

Epoxy resin having two or more epoxy groups in the molecule (trade name "KRM-2110", manufactured by Adeka Corporation) and a phenoxy resin (trade name "YP-50", manufactured by Tohto Kasei Co., Ltd., 35% methyl ethyl ketone solution) were blended in amounts of 70.4 mass % and 29.6 mass %, respectively and then the mixture was blended with a photopolymerization initiator (trade name "SP-170", manufactured by Adeka Corporation) in an amount of 2 mass parts per 100 mass parts of the resin components to provide a resin composition for forming optical waveguides. The resultant was applied on a polyester film (trade name "A4100", manufactured by Toyobo Co., Ltd.) using an applicator ("YBA-4", manufactured by Yoshimitsu Seiki Co., Ltd.) and dried under conditions of 80° C. for 10 minutes and then 100° C. for 10 minutes to evaporate the solvent, thereby obtaining a resin film for optical waveguides. The thickness of the film on this occasion could be adjusted between 5 μm and 100 μm by controlling the gap in the applicator. In this example, the thickness of the film was adjusted to 12 μm.

The resin film for forming optical waveguides was laminated on a silicon wafer (thickness 1 μm) with a thermal oxidation film (thickness 1 μm) using a vacuum pressure laminator (MVLP-500, manufactured by Meiki Co., Ltd.) under conditions of a pressure of 0.4 MPa and a temperature of 60° C. The resultant was irradiated with ultraviolet ray at an intensity of 1 J/cm$^2$ by means of "EXM-7172-B-00" (manufactured by ORC manufacturing Co., Ltd.) to optically cure the resin. Then, the resin was postbaked under conditions of 160° C. for 1 hour to obtain a slab optical waveguide (core thickness 12 μm). The refractive index of the obtained optical waveguide (core) was measured in the same manner as in Example 1. As a result, the refractive index obtained was 1.537 for both TE polarized light and TM polarized light. The slab optical waveguide was passed through a solder reflow oven ("Salamander", manufactured by Furukawa Electric Co., Ltd.) three times under conditions of maximum temperature of 265° C. (retention time of 15 to 20 seconds at 260° C. or more) and nitrogen atmosphere.

Optical transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.56). As a result, the optical transmission losses before and after reflow were found to be 0.1 dB/cm. This indicates that the resin film for forming optical waveguides had high heat resistance and low loss. Note that in the present example, the thermal oxidation film served as a lower cladding and air served as an upper cladding.

Further, the gap of the applicator was changed and a 50 μm-thick resin film for forming optical waveguides was prepared in the same manner as above. The film was exposed to light through a mask pattern and developed with N,N-dimethylformamide (room temperature, 40 seconds, vibration shaking) to form a pattern. As a result, fabrication of an optical waveguide having a line width of 50 μm was confirmed. The results are shown in Table 1.

Example 5

A resin film for forming optical waveguides was obtained in the same manner as that in Example 1 except that the epoxy resin having two or more epoxy groups in the molecule was replaced by "KRM-2199" trade name, manufactured by Adeka Corporation, and evaluated similarly. Note that the refractive index of the slab optical waveguide (core) was measured in the same manner as in Example 1, the refractive index was 1.529 for both TE polarized light and TM polarized light.

Optical transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.56). As a result, the optical transmission losses before and after reflow were found to be 0.1 dB/cm and 0.3 dB/cm, respectively. This indicates that the resin film for forming optical waveguides had high heat resistance and low loss.

Further, in the same manner as in Example 4, it was confirmed that an optical waveguide having a line width of 50 μm could be fabricated. The results are shown in Table 1.

Example 6

A resin film for forming optical waveguides was obtained in the same manner as that in Example 4 except that the epoxy resin having two or more epoxy groups in the molecule was replaced by "KRM-2408" trade name, manufactured by Adeka Corporation, and evaluated similarly. Note that the refractive index of the slab optical waveguide (core) was measured in the same manner as in Example 1, the refractive index was 1.532 for both TE polarized light and TM polarized light.

Optical transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.56). As a result, the optical transmission losses before and after reflow were found to be 0.1 dB/cm and 0.2 dB/cm, respectively. This indicates that the resin film for forming optical waveguides had high heat resistance and low loss.

Further, in the same manner as in Example 4, it was confirmed that an optical waveguide having a line width of 50 μm could be fabricated. The results are shown in Table 1.

Example 7

A resin film for forming optical waveguides was obtained in the same manner as that in Example 4 except that the base polymer was replaced by "YD-7020" trade name, manufactured by Tohto Kasei Co., Ltd. (solid epoxy resin at room temperature), and evaluated similarly. Note that the refractive index of the slab optical waveguide (core) was measured in the same manner as in Example 1, the refractive index was 1.573 for both TE polarized light and TM polarized light.

Optical transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.60). As a result, the optical transmission losses before and after reflow were found to be 0.2 dB/cm and 0.3 dB/cm, respectively. This indicates that the resin film for forming optical waveguides had high heat resistance and low loss.

Further, in the same manner as in Example 4, it was confirmed that an optical waveguide having a line width of 50 μm could be fabricated. The results are shown in Table 1.

Comparative Example 1 to 3

Preparation of resin films for forming optical waveguides in the same manner as in Examples 4 to 6, respectively, was attempted except that a base polymer not used in Examples 4 to 6. In each case, after the solvent was evaporated, no films could be formed from the resins and remained liquid. The results obtained are shown in Table 1.

form a lower cladding (FIG. 1(a)). Then, on the lower cladding, a core film was laminated using the above-mentioned vacuum pressure laminator under conditions of a pressure of 0.5 MPa and a temperature of 50° C. for a pressurization time of 30 seconds (FIG. 1(b)). Subsequently, ultraviolet ray (wavelength 365 nm) was irradiated at an intensity of 1000 mJ/cm2 through a photo mask using the above-mentioned

TABLE 1

| | (A) | (B) | (C) | | Optical transmission loss (dB/cm) | |
|---|---|---|---|---|---|---|
| | Base polymer | Photopolymerizable Compound | Polymerization initiator | Film formability | Before reflow | After reflow |
| Example 4 | YP-50 (29.6 mass %) | KRM-2110 (70.4 mass %) | SP-170 (2 Mass part) | Possible | 0.1 | 0.1 |
| Example 5 | YP-50 (29.6 mass %) | KRM-2199 (70.4 mass %) | SP-170 (2 Mass part) | Possible | 0.1 | 0.3 |
| Example 6 | YP-50 (29.6 mass %) | KRM-2408 (70.4 mass %) | SP-170 (2 Mass part) | Possible | 0.1 | 0.2 |
| Example 7 | YP-7020 (29.6 mass %) | KRM-2110 (70.4 mass %) | SP-170 (2 Mass part) | Possible | 0.2 | 0.3 |
| Comparative example 1 | None | KRM-2110 (100 Mass part) | SP-170 (2 Mass part) | Impossible | — | — |
| Comparative example 2 | None | KRM-2199 (100 Mass part) | SP-170 (2 Mass part) | Impossible | — | — |
| Comparative example 3 | None | KRM-2408 (100 Mass part) | SP-170 (2 Mass part) | Impossible | — | — |

Example 8

Using the composition shown in Table 2, resins for a core and a cladding, respectively, were provided. Methyl ethyl ketone as a solvent was added in an amount of 40 mass parts based on the total amount to prepare resin varnishes for a core and a cladding, respectively. Those were applied on a PET film ("A4100", manufactured by Toyobo Co., Ltd.) using an applicator ("YBA-4", manufactured by Yoshimitsu Seiki Co., Ltd.) and dried under conditions of 80° C. for 10 minutes and then 100° C. for 10 minutes to evaporate the solvent, thereby obtaining a resin film for optical waveguides. The thickness of the film could be adjusted between 5 μm and 100 μm by controlling the gap in the applicator. In this example, the thicknesses of the films after the curing were adjusted such that the core film was 50 μm thick, the lower cladding was 30 μm thick, and the upper cladding was 80 μm thick. Note that the refractive indices of the core film and cladding film were measured in the same manner as in Example 1 (measuring wavelength: 830 nm) to find that the core film had a refractive index of 1.586 and the cladding film had a refractive index of 1.537.

The lower cladding film was laminated on an FR-4 substrate (trade name "E-679F", manufactured by Hitachi Chemical Co., Ltd.) using a vacuum pressure laminator (MVLP-500, manufactured by Meiki Co., Ltd.) under conditions of a pressure of 0.5 MPa and a temperature of 50° C. for a pressurization time of 30 seconds. Then, to this was irradiated ultraviolet ray (wavelength 365 nm) at an intensity of 1000 mJ/cm$^2$ by an ultraviolet exposure device ("EXM-1172", manufactured by ORC manufacturing Co., Ltd.) to ultraviolet exposure device (FIG. 1(c)). Thereafter, the core pattern was developed using N,N-dimethylacetamide as a solvent (FIG. 1(d)). To clean the developer, methanol and water were used.

Then, an upper cladding was formed in the same conditions as those for forming the lower cladding. Finally, heat treatment was performed at 160° C. to fabricate an optical waveguide (FIG. 1(e)).

The transmission loss of the optical waveguide thus obtained were measured using a 855-nm LED ("Q81201", manufactured by Advantest Corporation) as a light source and a light receiving sensor ("Q82214", manufactured by Advantest Corporation) by a cut-back method (measured waveguide wavelength 5, 3, and 2 cm, input fiber; GI-50/125 multimode fiber (NA=0.20), output fiber; SI-114/125 (NA=0.22), input light; effective core diameter 26 μm) to find 0.3 dB/cm. Further, the fabricated optical waveguide were passed through a solder reflow oven ("Salamander", manufactured by Furukawa Electric Co., Ltd.) three times under conditions of a maximum temperature of 265° C. (retention time of 15 to 20 seconds at 260° C. or more) and nitrogen atmosphere, and loss degradation by reflow was measured. As a result, no increase in loss by reflow was observed. This indicated that the optical waveguide fabricated using the resin film for forming optical waveguides of the present invention had high heat resistance and low loss.

Further, checking the pattern formability of the resin film confirmed that fine patterns with line/space of 30/95 μm, 40/85 μm, and 50/75 μm could be formed (Table 3).

TABLE 2

| | (A) Base polymer | (B) Photopolymerizable compound | (C) Polymerization initiator |
|---|---|---|---|
| For core | Phenototo YP-70[*1] (20.4 mass %) | A-BPEF[*2] (39.8 mass %) | 2,2-Bis(2-chlorophenyl)-4,4',5,5'-tetraphenyl 1,2'-biimidazole[*5] (1 mass part) |
| | | EA-1020[*3] (39.8 mass %) | 4,4'-Bis(diethylamino)benzophenone[*6] (0.5 mass parts) 2-Mercaptobenzimidazole[*7] (0.5 mass parts) |
| For cladding | Phenototo YP-70[*1] (35.7 mass %) | KRM-2110[*4] (64.3 mass %) | SP-170[*8] (2 mass parts) |

[*1]Phenototo YP-70; Phenoxy resin (manufactured by Tohto Kasei Co., Ltd.), bisphenol A/bisphenol F copolymer type phenoxy resin
[*2]A-BPEF; fluorene diacrylate (manufactured by Shin-Nakamura Chemical Co., Ltd.), 9,9-bis[4-(2-acryloyloxyethoxy)phenyl]fluorene
[*3]EA-1020; bisphenol A type epoxyacrylate (manufactured by Shin-Nakamura Chemical Co., Ltd.), bisphenol A type epoxyacrylate
[*4]KRM-2110; 2-functional alicyclic epoxy resin (manufactured by Adeka Corporation), alicyclic diepoxy carboxylate
[*5]2,2-bis(2-chlorophenyl)-4,4',5,5'-tetraphenyl-1,2'-biimidazole; manufactured by Tokyo Chemical Industry Co., Ltd.
[*6]4,4'-Bis(diethylamino)benzophenone; manufactured by Tokyo Chemical Industry Co., Ltd.
[*7]2-Mercaptobenzimidazole; manufactured by Tokyo Chemical Industry Co., Ltd.
[*8]SP-170; triphenylsulfonium hexafluoroantimonate

Example 9

A flexible optical waveguide was fabricated in the same manner as that in Example 8 except that for the photopolymerization initiator (C) for core in Table 2, bis(2,4,6-trimethylbenzoyl)phenylphosphine oxide (1 mass part, manufactured by Ciba Specialty Chemicals) was replaced by 1-[4-(2-hydroxyethoxy)phenyl]-2-hydroxy-2-methyl-1-propan-1-one (1 mass part, manufactured by Chiba Specialty Chemicals), and the irradiation dose of ultraviolet ray upon exposure of the core pattern was changed to 400 mJ/cm$^2$. Note that in this case, the refractive index of the core layer measured using a prism coupler (Model 2020) manufactured by Metricon Corporation was 1.582.

The transmission loss of the optical waveguide thus obtained was measured by the cut-back method in the same manner as in Example 8 (measured waveguide wavelength 5, 3, and 2 cm, input fiber; GI-50/125 multimode fiber (NA=0.20), output fiber; SI-114/125 (NA=0.22), input light; effective core diameter 26 μm) was 0.1 dB/cm. This indicated that when the initiator in this example was used, the obtained optical waveguide had a very high transparency. Further, loss deterioration due to reflow was measured in the same manner as in Example 8, which gave an increase in loss of below 0.1 dB/cm, confirming that the fabricated optical waveguide had high heat resistance.

Reference Example 1

A flexible optical waveguide was fabricated in the same manner as that in Example 8 except that Phenototo YP-70 was replaced by Phenototo YP-50 (bisphenol A type epoxy resin, manufactured by Tohto Kasei Co., Ltd.). The transmission loss of the flexible optical waveguide was 0.3 dB/cm and no increase in loss due to reflow was observed. However, patterns at a line/space of 30 μm/95 μm, and 50 μm/75 μm could not be formed (Table 3). The pattern at a line/space of 30 μm/95 μm showed peeling of core due to insufficient cladding/core interface adhesion while the pattern at a line/space of 50 μm/75 μm showed development residue due to low solubility of unexposed portions.

TABLE 3

| | Transmission loss (dB/cm) | | Pattern formability (line/space) | | |
|---|---|---|---|---|---|
| | Before reflow | After reflow | 30/95 (μm) | 40/85 (μm) | 50/75 (μm) |
| Example 8 | 0.3 | 0.3 | Possible | Possible | Possible |
| Reference example 1 | 0.3 | 0.3 | Impossible | Possible | Impossible |

Example 10

To fluorene diacrylate (trade name "A-BPEF", manufactured by Shin-Nakamura Chemical Co., Ltd.) was added 2 mass % of a photopolymerization initiator (a three-component optical radical generator consisting of "2,2-bis(2-chlorophenyl)-4,4',5,5'-tetraphenyl 1,2'-biimidazole" manufactured by Tokyo Chemical Industry Co., Ltd.); "4,4'-bis (diethylamino)benzophenone" manufactured by Tokyo Chemical Industry Co., Ltd., and "2-mercaptobenzimidazole" manufactured by Tokyo Chemical Industry Co., Ltd.) and N,N-dimethylacetamide as a solvent in an amount of 30 mass parts per total 100 mass parts of fluorene diacrylate and the optical initiator to provide a resin composition for forming optical waveguides. Then, a resin layer was formed on a silicon wafer (thickness 1 μm) with a thermal oxidation film (thickness 1 μm) by a spin coating method and dried under conditions of 80° C. for 10 minutes and then 100° C. for 10 minutes to evaporate and remove the solvent. Subsequently, the resultant resin layer was irradiated with ultraviolet ray at an intensity of 1 J/cm$^2$ from a high-pressure mercury lamp to optically cure the resin. Further, the resin was postbaked under conditions of 160° C. for 1 hour to obtain a slab optical waveguide (core thickness 10 μm). The refractive index of the obtained slab optical waveguide (core) was measured in the same manner as in Example 1, thereby observing a refractive index of 1.613 for both TE polarized light and TM polarized light. Further, measurement of the slab optical waveguide using TGD-7000, manufactured by ULVAC indicated that the slab optical waveguide had a thermal decomposition temperature of about 300° C., confirming that it had high heat resistance.

The slab optical waveguide was passed through a solder reflow oven ("Salamander", manufactured by Furukawa Electric Co., Ltd.) three times under conditions of maximum temperature of 265° C. (retention time of 15 to 20 seconds at 260° C. or more) and nitrogen atmosphere. Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.62). As a result, the transmission losses before and after reflow were found to be 0.1 dB/cm and 0.1 dB/cm, respectively. This indicates that the resin film for forming optical waveguides had high heat resistance and low loss. Note that in the present example, the thermal oxidation film served as a lower cladding and air served as an upper cladding.

Example 11

To fluorene diacrylate (trade name "A-BPEF", manufactured by Shin-Nakamura Chemical Co., Ltd.) was added as a base polymer, a phenoxy resin (trade name "Phenototo YP-50", manufactured by Tohto Kasei Co., Ltd.) such that fluorene diacrylate was in an amount of 80 mass % and the phenoxy resin was in an amount of 20 mass %, as well as an optical initiator in an amount of 2 mass parts per total 100 mass parts of the resins (a three-component optical radical generator consisting of "2,2-bis(2-chlorophenyl)-4,4',5,5'-tetraphenyl 1,2'-biimidazole" manufactured by Tokyo Chemical Industry Co., Ltd.); "4,4'-bis(diethylamino)benzophenone" manufactured by Tokyo Chemical Industry Co., Ltd., and "2-mercaptobenzimidazole" manufactured by Tokyo Chemical Industry Co., Ltd.). To the resultant was added 40 mass parts of methyl ethyl ketone as a solvent to provide a resin composition for forming optical waveguides. The resin composition was applied on a PET film ("A4100", manufactured by Toyobo Co., Ltd.) using an applicator ("YBA-4", manufactured by Yoshimitsu Seiki Co., Ltd.) and dried under conditions of 80° C. for 10 minutes and then 100° C. for 10 minutes to evaporate and remove the solvent, thereby obtaining a resin film for optical waveguides. The thickness of the resin film for optical waveguides could be adjusted between 5 μm and 100 μm by controlling the gap in the applicator. In this example, the thickness of the resin film was adjusted to 12 μm.

The resin film for forming optical waveguides was laminated on a silicon wafer (thickness 1 μm) with a thermal oxidation film (thickness 1 μm) using a vacuum pressure laminator (MVLP-500, manufactured by Meiki Co., Ltd.) under conditions of a pressure of 0.4 MPa and a temperature of 60° C. To this was irradiated ultraviolet ray at an intensity of 1 J/cm$^2$ by an ultraviolet exposure device ("EXM-7172", manufactured by ORC manufacturing Co., Ltd.) to optically cure the resin and then post baking was performed under conditions of at 160° C. for 1 hour to obtain a slab optical waveguide (core thickness 12 μm). The refractive index of the obtained slab optical waveguide (core) was measured in the same manner as in Example 1, thereby obtaining a refractive index of 1.607 for both TE polarized light and TM polarized light. The slab optical waveguide was passed through a solder reflow oven ("Salamander", manufactured by Furukawa Electric Co., Ltd.) three times under conditions of maximum temperature of 265° C. (retention time of 15 to 20 seconds at 260° C. or more) and nitrogen atmosphere. Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.62). As a result, the transmission losses before and after reflow were found to be 0.2 dB/cm and 0.2 dB/cm, respectively. This indicates that the resin film for forming optical waveguides had high heat resistance and low loss.

Example 12

A slab optical waveguides was obtained in the same manner as that in Example 11 except that solid epoxy resin at room temperature (trade name "Epototo YD-7020", manufactured by Tohto Kasei Co., Ltd.) was used in place of the phenoxy resin in Example 11. The refractive index of the slab optical waveguide (core) was measured in the same manner as in Example 1. As a result, the refractive index was 1.604 for both TE polarized light and TM polarized light. This was passed through a solder reflow oven ("Salamander", manufactured by Furukawa Electric Co., Ltd.) three times under conditions of a maximum temperature of 265° C. (retention time of 15 to 20 seconds at 260° C. or more) and nitrogen atmosphere. Transmission losses before and after reflow were measured using a prism coupler optical characteristics measuring apparatus (SPA-4000, manufactured by SAIRON TECHNOLOGY, INC.) (measuring wavelength: 830 nm, using matching oil of nD=1.62). As a result, the transmission losses before and after reflow were found to be 0.2 dB/cm and 0.2 dB/cm, respectively. This indicates that the resin film for forming optical waveguides had high heat resistance and low loss.

Example 13

Using the composition shown in Table 2, resin compositions for a core and a cladding, respectively, were provided. Ethyl cellosolve as a solvent was added in an amount of 40 mass parts based on the total amount to prepare resin varnishes for a core and a cladding, respectively.

These were applied on a PET film ("Cosmo Shine A1517", manufactured by Toyobo Co., Ltd., thickness 16 μm) using an applicator ("YBA-4", manufactured by Yoshimitsu Seiki Co., Ltd.) (resin film for forming a cladding layer: a wound adhesive-treated surface was used, resin film for forming a core layer: a unwound non-treated surface was used) and dried under conditions of 80° C. for 10 minutes and then 100° C. for 10 minutes to dry the solvent, thereby obtaining resin films for forming a core layer and cladding layer, respectively. The thickness of the film could be adjusted between 5 μm and 100 μm by controlling the gap in the applicator. In this example, the thicknesses of the films after the curing were adjusted such that the core film was 40 μm thick, the lower cladding was 20 μm thick, and the upper cladding was 70 μm thick.

Figure 2:
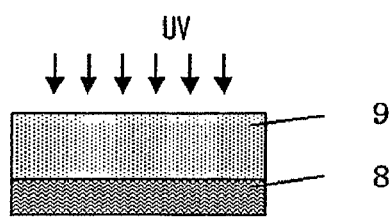
FIG. 2 is a diagram illustrating the method of producing a flexible optical waveguide.
Figure 2:
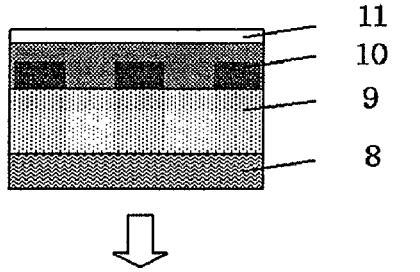
Figure 2:
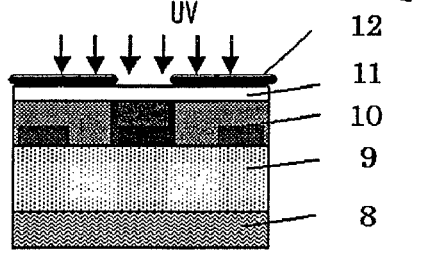
Figure 2:
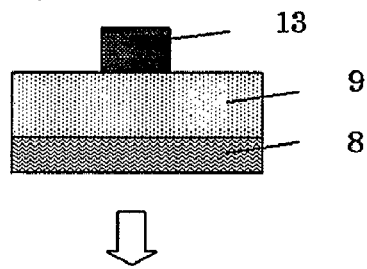
Figure 2:
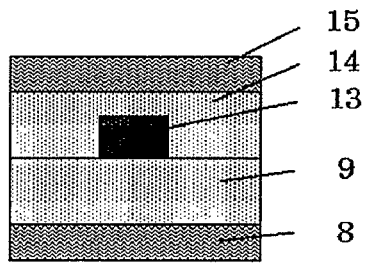

To this was irradiated ultraviolet ray at an intensity of 1000 mJ/cm$^2$ by an ultraviolet exposure device ("EXM-1172", manufactured by ORC manufacturing Co., Ltd.) to optically cure the resin (FIG. 2(a)). Then, a resin film for forming a core layer was laminated on the cladding layer using a vacuum pressure laminator (MVLP-500, manufactured by Meiki Co., Ltd.) under conditions of a pressure of 0.4 MPa, a temperature of 70° C., and a pressure time of 30 seconds (see, FIG. 2(b)). Subsequently, this was irradiated with ultraviolet ray at an intensity of 1000 mJ/cm$^2$ through a photo mask (negative type) of 40 μm in width using the above-mentioned ultraviolet exposure device (wavelength 365 nm) (see, FIG. 2(c)), and then the core pattern was developed with a mixed solvent consisting of 8:2 mixture of ethyl cellosolve and N,N-dimethylacetamide (see, FIG. 2(d)). To clean the developer, methanol and water were used. Then, a resin film for forming an upper cladding was laminated on the core pattern under similar lamination conditions, irradiated with ultraviolet ray, and heat-treated at 110° C. to fabricate a flexible optical waveguide (see, FIG. 2(e)).

Note that the refractive index of the core layer and the cladding layer was measured using a prism coupler (Model 2010) manufactured by Metricon Corporation at a wavelength of 850 nm. The refractive index obtained was 1.584 for the core layer and 1.537 for the cladding layer.

The transmission loss of the flexible optical waveguide was measured using a 855-nm LED ("Q81201", manufactured by Advantest Corporation) as a light source by a cut-back method (measured waveguide wavelengths of 5, 3, and 2 cm, input fiber; GI-50/125 multimode fiber (NA=0.20), output fiber; SI-114/125 (NA=0.22), input light; effective core diameter 26 μm), thereby observing 0.3 dB/cm.

Further, winding flexibility around a pole having radius of 2 mm and toughness were examined. The results showed that neither cracks were observed in the optical waveguide nor interface separation between the cladding layer and the core layer occurred, thus indicating that the optical waveguide had high flexibility and toughness.

Example 14

An optical waveguide was fabricated in the same manner as in Example 13 except that the photopolymerization initiator (C) for core in Table 4 was changed to bis(2,4,6-trimethylbenzoyl)phenylphosphine oxide (1 mass part, manufactured by Ciba Specialty Chemicals) 1-[4-(2-hydroxyethoxy)phenyl] and -2-hydroxy-2-methyl-1-propan-1-one (1 mass part, manufactured by Ciba Specialty Chemicals), and the irradiation dose of ultraviolet ray upon exposure of the core pattern was changed to 400 mJ/cm$^2$. The refractive index of the core layer measured using a prism coupler (Model 2010) manufactured by Metricon Corporation was 1.582.

The transmission loss of the flexible optical waveguide thus obtained measured in the same manner as in Example 13 was found to be 0.1 dB/cm, indicating that use of an initiator in this example provided very high transparency.

Example 15

Using the composition shown in Table 4, resin compositions for a core and a cladding, respectively, were provided. Ethyl cellosolve as a solvent was added in an amount of 40 mass parts based on the total amount to prepare resin varnishes for a core layer and a cladding layer, respectively.

The varnish for forming a cladding layer was applied on a corona-discharge-treated surface of a polyamide film (trade name "Mictron", manufactured by Toray Industries, Inc., 12 μm thick) and the varnish for forming a core was applied on a non-treated surface of a PET film (trade name "Cosmo Shine A1517", manufactured by Toyobo Co., Ltd., 16 μm thick) using an applicator (trade name "YBA-4", manufactured by Yoshimitsu Seiki Co., Ltd.) and the solvent was dried at 80° C. for 10 minutes and then 100° C. for 10 minutes to obtain resin films for forming a core layer and a cladding layer. The thickness of the films on this occasion could be adjusted between 5 μm and 100 μm by controlling the gap in the applicator. In this example, the thickness of the films after curing was adjusted to 40 μm for the core layer, 20 μm for the lower cladding layer, and 70 μm for the upper cladding layer.

To this was irradiated ultraviolet ray at an intensity of 1000 mJ/cm$^2$ by an ultraviolet exposure device ("EXM-1172", manufactured by ORC manufacturing Co., Ltd.) to optically cure the resin (FIG. 2(a)). Then, a resin film for forming a core layer was laminated on the cladding layer using a vacuum pressure laminator (MVLP-500, manufactured by Meiki Co., Ltd.) under conditions of a pressure of 0.4 MPa, a temperature of 70° C. and a pressure time of 30 seconds (see, FIG. 2(b)). Subsequently, this was irradiated with ultraviolet ray at an intensity of 400 mJ/cm$^2$ through a photo mask (negative type) of 40 μm in width using the above-mentioned ultraviolet exposure device (see, FIG. 2(c)), and then the core pattern was developed with a mixed solvent consisting of 8:2 mixture of ethyl cellosolve and N,N-dimethylacetamide (see, FIG. 2(d)). To clean the developer, methanol and water were used. Then, a resin film for forming an upper cladding was laminated on the core pattern under similar lamination conditions, irradiated with ultraviolet ray by using "Eyedolphin 3000" (manufactured by Eye graphics Co., Ltd.) (wavelength 405 nm), and then heat-treated at 160° C. to fabricate a flexible optical waveguide (see, FIG. 2(e)).

Note that the refractive index of the obtained optical waveguide was measured using a prism coupler (Model 2010) manufactured by Metricon Corporation at a wavelength of 850 nm. The refractive index obtained was 1.582 for the core layer and 1.539 for the cladding layer.

The transmission loss of the flexible optical waveguide was measured using a 855-nm LED ("Q81201", manufactured by Advantest Corporation) as a light source by a cut-back method (measured waveguide wavelengths of 5, 3, 2 cm, input fiber; GI-50/125 multimode fiber (NA=0.20), output fiber; SI-114/125 (NA=0.22), input light; effective core diameter 26 μm), thereby observing 0.1 dB/cm and extremely low loss.

TABLE 4

| | (A) Base polymer | (B) Photopolymerizable compound | (C) Polymerization initiator |
|---|---|---|---|
| Core | Phenototo YP-70[*1] (20 mass parts) | A-BPEF[*2] (39 mass parts) | Bis(2,4,6-trimethylbenzoyl)phenylphosphine oxide[*9] (1 mass part) |
| | | EA-1020[*3] (39 mass parts) | 1-[4-(2-Hydroxyethoxy)phenyl]-2-hydroxy-2-methyl-1-propan-1-one[*10] (1 mass part) |
| Cladding | Phenototo YP-70[*1] (35 mass parts) | KRM-2110[*4] (62.5 mass parts) | SP-170[*8] (2 mass parts) SP-100[*11] (0.5 mass parts) |

[*1] to [*4] and [*8] Above mentioned.
[*9] Bis(2,4,6-trimethylbenzoyl)phenylphosphine oxide; manufactured by Ciba Specialty Chemicals
[*10] 1-[4-(2-Hydroxyethoxy)phenyl]-2-hydroxy-2-methyl-1-propan-1-one; manufactured by Ciba Specialty Chemicals
[*11] SP-100; aromatic compound, manufactured by Adeka Corporation.

Further, the fabricated flexible optical waveguide was passed through a solder reflow oven ("Salamander", manufactured by Furukawa Electric Co., Ltd.) three times under conditions of a maximum temperature of 265° C. (retention time of 15 to 20 seconds at 260° C. or more) and nitrogen atmosphere, and an increase in loss by reflow was measured. As a result, an increase in loss by reflow was found to be below 0.1 dB/cm. This indicated that when polyamide was used as the base material film, the resultant flexible optical waveguide had high heat resistance.

Further, winding flexibility around a pole having radius of 2 mm and toughness were examined. The results showed that neither cracks were observed in the optical waveguide nor interface separation between the cladding layer and the base material film or between the cladding layer and the core layer occurred, thus indicating that the optical waveguide had high flexibility and toughness.

Example 16

A flexible optical waveguide was fabricated in the same manner as that in Example 13 except that the resin film for forming a cladding was applied to the unwound (non-treated surface) of a PET film. In this case, when the obtained flexible optical waveguide was wound around a pole having a radius of 2 mm, some peeling occurred on the interface between the cladding layer and the base material film and cracks occurred on the flexible optical waveguide. However, the flexible optical waveguide had sufficient flexibility and toughness for practical purposes.

Example 17

The core film and cladding film (both 10 μm thick) prepared in the same manner as that in Example 8 were measured for refractive index and birefringence using a prism coupler (Model 2020) manufactured by Metricon Corporation. The results obtained are shown in Table 5. The obtained core film and cladding film had high refractive index at each measuring wavelength while they showed no birefringence and thus revealed to be excellent optical materials.

Further, the core film and cladding film (both 70 μm thick) prepared in the same manner as that in Example 8 were measured for light transmissivity of resin films for optical materials (having the same composition as that of the core film in the example, 70 μm thick) using a spectrophotometer (Model U-3410) manufactured by Hitachi Chemical Co., Limited. As a result, both the films had 90% or more transmissivity in the visible light range of 400 to 800 nm, demonstrating that they were resin films for optical materials having excellent transparency.

TABLE 5

| | | Refractive index | | |
| --- | --- | --- | --- | --- |
| | Wavelength (nm) | TE Polarized light | TM Polarized light | Birefringence |
| Core film | 633 | 1.594 | 1.594 | 0.000 |
| | 830 | 1.586 | 1.586 | 0.000 |
| | 1300 | 1.577 | 1.577 | 0.000 |
| | 1550 | 1.576 | 1.576 | 0.000 |
| Cladding film | 633 | 1.544 | 1.546 | 0.001 |
| | 830 | 1.537 | 1.536 | 0.001 |
| | 1300 | 1.530 | 1.530 | 0.000 |
| | 1550 | 1.529 | 1.529 | 0.000 |

Examples 18 to 27

The resin compositions of the above-mentioned examples described in Table 6 were applied to a silicon substrate to fabricate resin films for optical materials having a thickness of 10 μm and their refractive index and birefringence were measured (measuring wavelength 830 nm) using a prism-coupler (Model 2020) manufactured by Metricon Corporation). Further, they were measured for light transmissivity in the same manner as that in Example 17. The results obtained are shown in Table 6.

The resin films for optical materials in Example 18 to 24 showed no birefringence and revealed to be excellent optical materials having high transparency. Further, the resin films for optical materials in Examples 25 to 27 were excellent optical materials, respectively, since they had high refractive index while they had less birefringence, and still had high transparency.

TABLE 6

| | | Refractive index | | | |
| --- | --- | --- | --- | --- | --- |
| Example | Resin Composition | TE Polarized light | TM Polarized light | Birefringence | Transmissivity |
| 18 | Example 1 | 1.583 | 1.583 | 0.000 | 90% or more |
| 19 | Example 2 | 1.565 | 1.565 | 0.000 | 90% or more |
| 20 | Example 3 | 1.506 | 1.506 | 0.000 | 90% or more |
| 21 | Example 4 | 1.537 | 1.537 | 0.000 | 90% or more |
| 22 | Example 5 | 1.529 | 1.529 | 0.000 | 90% or more |
| 23 | Example 6 | 1.532 | 1.532 | 0.000 | 90% or more |
| 24 | Example 7 | 1.573 | 1.573 | 0.000 | 90% or more |
| 25 | Example 10 | 1.613 | 1.611 | 0.002 | 90% or more |
| 26 | Example 11 | 1.607 | 1.604 | 0.001 | 90% or more |
| 27 | Example 12 | 1.604 | 1.603 | 0.001 | 90% or more |

INDUSTRIAL APPLICABILITY

The resin composition for an optical material of the present invention and the resin films for optical materials that includes the resin composition of the present invention have excellent transparency and heat resistance and can be used as, for example, an optical waveguide, a lens, an optical sealant, an optical adhesive, a light guide panel, or a diffractive grating. In particular, they can be advantageously used as a resin film for optical waveguide. In addition, they can be used as a coating material, a resist and so on. When they are used as a resin film for optical waveguides, it is possible to form a thick film having high transparency, high heat resistance, and high precision. Therefore, by using the film of the present invention in at least one of the lower cladding, core, and upper cladding, an optical waveguide having excellent performance can be obtained. Further, according to the present invention, a large-area film can be produced, so optical waveguides can be produced with high productivity.

The invention claimed is:

1. A flexible optical waveguide, comprising a core layer of a resin film, and first and second cladding layers sandwiching the core layer, the first cladding layer including two resin films, wherein one of the resin films of the first cladding layer is composed of a resin for forming the first cladding layer and the other resin film is a base material film, and the base material film is arranged on an outer side of the resin for forming the first cladding layer with respect to the core layer, and wherein said base material film has been subjected to adhesion treatment selected from the group consisting of corona treatment and sandblasting prior to providing the resin for forming the first cladding layer thereon.

2. A flexible optical waveguide according to claim 1, wherein said base material film has a thickness in a range of 5 μm to 250 μm.

3. A flexible optical waveguide according to claim 1, wherein said base material film is made of a material selected from the group consisting of polyesters, polyethylene, polypropylene, polyamide, polycarbonate, polyphenylene ether, polyether sulfide, polyallylate, liquid crystal polymer, polysulfone, polyether sulfone, polyether ether ketone, polyether imide, polyamideimide and polyimide.

4. A flexible optical waveguide according to claim 1, further comprising another base material film, on an outer side of the second cladding layer with respect to the core layer.

* * * * *